United States Patent
Sturcken

(10) Patent No.: US 9,337,251 B2
(45) Date of Patent: May 10, 2016

(54) INTEGRATED MAGNETIC CORE INDUCTORS WITH INTERLEAVED WINDINGS

(71) Applicant: Ferric Semiconductor Inc., New York, NY (US)

(72) Inventor: Noah Andrew Sturcken, New York, NY (US)

(73) Assignee: Ferric, Inc., New York, NY (US)

( * ) Notice: Subject to any disclaimer, the term of this patent is extended or adjusted under 35 U.S.C. 154(b) by 0 days.

(21) Appl. No.: 14/160,923

(22) Filed: Jan. 22, 2014

(65) Prior Publication Data
US 2014/0203398 A1    Jul. 24, 2014

Related U.S. Application Data

(60) Provisional application No. 61/755,325, filed on Jan. 22, 2013.

(51) Int. Cl.
*H01L 23/522* (2006.01)
*H01F 17/00* (2006.01)
(Continued)

(52) U.S. Cl.
CPC ............ *H01L 28/10* (2013.01); *H01F 17/0033* (2013.01); *H01L 23/5227* (2013.01); *H01F 27/2804* (2013.01); *H01F 2017/0086* (2013.01); *H01L 2924/0002* (2013.01)

(58) Field of Classification Search
USPC ........................................................ 336/220
See application file for complete search history.

(56) References Cited

U.S. PATENT DOCUMENTS

| 1,553,983 A |   | 9/1925  | Casper  |              |
|-------------|---|---------|---------|--------------|
| 2,931,966 A |   | 4/1960  | Rockey  |              |
| 3,614,554 A | * | 10/1971 | Shield  | H01F 17/0033 |
|             |   |         |         | 257/531      |

(Continued)

FOREIGN PATENT DOCUMENTS

| FR | 2817622  | * | 6/2002 | ........... G01R 33/026 |
| JP | 60124859 |   | 7/1985 |                         |

(Continued)

OTHER PUBLICATIONS

Lee et al., Design and Fabrication of Integrated Solenoid Indictors with Magnetic Cores, 2008 Electronic Components and Technology Conference, pp. 701-705, 2008.*

(Continued)

*Primary Examiner* — Marc Armand
*Assistant Examiner* — Younes Boulghassoul
(74) *Attorney, Agent, or Firm* — Intrinsic Law Corp.

(57) ABSTRACT

A coupled inductor topology for a thin-film magnetic core power inductor that enables efficient integrated power conversion. Coupled magnetic core inductors with interleaved windings inductors comprise magnetic films and partially or fully interleaved conductors. Methods described herein are suitable for integration into monolithic, chip stacking fabrication or other traditional semiconductor device fabrication techniques and equipment. Soft ferromagnetic materials exhibiting high permeability and low coercivity are deposited using thin-film techniques. A plurality of electrical conductors surround at least one ferromagnetic core giving rise to two or more windings. Windings are coupled to one another through magnetic core(s). Windings are used to control permeability, inductance and magnetic saturation, finding particular utility in high magnetic flux applications.

17 Claims, 18 Drawing Sheets

(51) Int. Cl.
*H01L 49/02* (2006.01)
*H01F 27/28* (2006.01)

(56) References Cited

U.S. PATENT DOCUMENTS

| | | | |
|---|---|---|---|
| 5,070,317 A | 12/1991 | Bhagat | |
| 5,225,971 A | 7/1993 | Spreen | |
| 5,319,343 A | 6/1994 | Jeffries | |
| 5,583,474 A | 12/1996 | Mizoguchi | |
| 5,635,892 A | 6/1997 | Ashby | |
| 6,362,986 B1 | 3/2002 | Schultz | |
| 6,542,060 B2* | 4/2003 | Fedeli | B82Y 25/00 336/174 |
| 6,542,379 B1 | 4/2003 | Lauffer | |
| 6,856,226 B2 | 2/2005 | Gardner | |
| 6,940,384 B2 | 9/2005 | Hooey et al. | |
| 7,636,242 B2 | 12/2009 | Hazucha | |
| 7,719,084 B2 | 5/2010 | Gardner | |
| 7,867,787 B2 | 1/2011 | Gardner | |
| 8,108,984 B2 | 2/2012 | Gardner | |
| 2003/0070282 A1* | 4/2003 | Hiatt et al. | 29/602.1 |
| 2005/0088269 A1* | 4/2005 | Hatano | H01F 17/0033 336/200 |
| 2007/0290362 A1 | 12/2007 | Hsu et al. | |
| 2008/0316647 A1* | 12/2008 | Joisten | G01R 33/05 360/125.01 |
| 2009/0175014 A1 | 7/2009 | Zeng et al. | |
| 2009/0188104 A1* | 7/2009 | Ching | H01F 41/046 29/602.1 |
| 2011/0279214 A1* | 11/2011 | Lee et al. | 336/220 |
| 2013/0056847 A1* | 3/2013 | Chen | 257/531 |
| 2013/0099334 A1* | 4/2013 | Mohan | G01R 33/04 257/421 |
| 2014/0027879 A1* | 1/2014 | Weyers | H01L 28/10 257/531 |
| 2014/0068932 A1 | 3/2014 | Sturcken | |
| 2014/0071636 A1* | 3/2014 | Sturcken | H05K 1/115 361/748 |
| 2015/0036308 A1 | 2/2015 | Sturcken | |
| 2015/0187488 A1* | 7/2015 | Williams | H05K 3/061 336/192 |

FOREIGN PATENT DOCUMENTS

| | | |
|---|---|---|
| JP | 05082736 A | 4/1993 |
| JP | 05291063 | 11/1993 |
| JP | H09162354 A | 6/1997 |

OTHER PUBLICATIONS

Derwent Abstract translation of Foreign Patent FR2817622, and complete foreign application.*
Sturcken et al, "A 2.5D Integrated Voltage Regulator Using Coupled-Magnetic-Core Inductors on Silicon Interposer Delivering 10.8A/mm2", ISSCC 2012, vol. 23, Issue 1.
Sturcken et al., "Design of Coupled Power Inductors with Crossed Anisotropy Magnetic Core for Integrated Power Conversion", IEEE-APEC 2012, p. 417-423, doi: 10.1109/APEC.2012.6165853.

* cited by examiner

INTEGRATED MAGNETIC CORE INDUCTORS WITH INTERLEAVED WINDINGS

RELATED APPLICATIONS

This application is related to and claims priority to U.S. Provisional Application No. 61/755,325 entitled, "Coupled Magnetic Core Inductors with Interleaved Windings" filed on Jan. 22, 2013, which is hereby incorporated by reference in its entirety.

TECHNICAL FIELD

The present application is directed to coupled magnetic core inductors with interleaved windings. Specifically, ferromagnetic core inductors comprise interleaved conductors to be used on-chip in microelectronic applications, particularly integrated switch-inductor power conversion.

BACKGROUND

The increase in computing power, spatial densities in semiconductor based devices and energy efficiency of the same allow for ever more efficient and small microelectronic sensors, processors and other machines. These have found wide use in mobile and wireless applications and other industrial, military, medical and consumer products.

Even though computing energy efficiency is improving over time, the total amount of energy used by computers of all types is on the rise. Hence, there is a need for even greater energy efficiency. Most efforts to improve the energy efficiency of microelectronic devices has been at the chip and transistor level, including with respect to transistor gate width. However, these methods are limited and other approaches are necessary to increase device density, processing power and to reduce power consumption and heat generation in the same.

One field that can benefit from the above improvements is in switched inductor power conversion devices. Power supplies include power converters that convert one form of electrical energy to another. A regulated power supply is one that controls the output voltage or current to a specific value; the controlled value is held nearly constant despite variations in either load current or the voltage supplied by the power supply's energy source.

Switched-mode power supplies are usually regulated, and to keep the output voltage constant, the power supply employs a feedback controller that monitors current drawn by the load. The switching duty cycle increases as power output requirements increase which puts increasing demands on the constituent components, particularly the inductors. Switch-mode power supplies also use filters or additional switching stages in the incoming rectifier circuit to improve the waveform of the current when the input power is taken from an AC line. This adds to the circuit complexity, with the inclusion of additional inductors and capacitors.

Additionally, the delivery of low voltage/high current power is also challenging because power loss increases with higher currents, pursuant to Ohm's law:

$$P_{loss} = I^2 R$$

where, Ploss is the power loss over the length of wire and circuit trace, I is the current and R is the inherent resistance over the length of wire and circuit trace. As such, and to increase overall performance, there has been a recognized need in the art for large scale integration of compact and dense electrical components at the chip level, such as, for use with the fabrication of complementary metal oxide semiconductors (CMOS).

With the development of highly integrated electronic systems that consume large amounts of electricity in very small areas, the need arises for new technologies which enable improved energy efficiency and power management for future integrated systems. Integrated power conversion is a promising potential solution as power can be delivered to integrated circuits at higher voltage levels and lower current levels. That is, integrated power conversion allows for step down voltage converters to be disposed in close proximity to transistor elements.

Unfortunately, practical integrated inductors that are capable of efficiently carrying large current levels for switched-inductor power conversion are not available. Specifically, inductors that are characterized by high inductance (>1 nH), low resistance (<1 Ohm), high maximum current rating (>100 mA), and high frequency response whereby no inductance decrease for alternating current (AC) input signal greater than 1 MHz are unavailable or impractical using present technologies.

Furthermore, all of these properties must be economically achieved in a small area, typically less than 1 mm², a form required for CMOS integration either monolithically or by 3D or 2.5D chip stacking. Thus, an inductor with the aforementioned properties is necessary in order to implement integrated power conversion with high energy efficiency and low inductor current ripple which engenders periodic noise in the output voltage of the converter, termed output voltage ripple.

The use of high permeability, low coercivity material is typically required to achieve the desired inductor properties on a small scale. In electromagnetism, permeability is the measure of the ability of a material to support the formation of a magnetic field within itself. In other words, it is the degree of magnetization that a material obtains in response to an applied magnetic field. A high permeability denotes a material achieving a high level of magnetization for a small applied magnetic field.

Coercivity, also called the coercive field or force, is a measure of a ferromagnetic or ferroelectric material to withstand an external magnetic or electric field. Coercivity is the measure of hysteresis observed in the relationship between applied magnetic field and magnetization. The coercivity is defined as the applied magnetic field strength necessary to reduce the magnetization to zero after the magnetization of the sample has reached saturation. Thus coercivity measures the resistance of a ferromagnetic material to becoming demagnetized. Ferromagnetic materials with high coercivity are called magnetically hard materials, and are used to make permanent magnets. Ferromagnetic materials that exhibit a high permeability and low coercivity are called magnetically soft materials, and are often used to enhance inductance of conductors.

Coercivity is determined by measuring the width of the hysteresis loop observed in the relationship between applied magnetic field and magnetization. Hysteresis is the dependence of a system not only on its current environment but also on its past environment. This dependence arises because the system can be in more than one internal state. When an external magnetic field is applied to a ferromagnet such as iron, the atomic dipoles align themselves with it. Even when the field is removed, part of the alignment will be retained: the material has become magnetized. Once magnetized, the magnet will stay magnetized indefinitely. To demagnetize it requires heat or a magnetic field in the opposite direction.

High quality inductors are typically made from high permeability, low coercivity material. However, high permeability materials tend to saturate when biased by a large direct current (DC) magnetic field. Magnetic saturation can have adverse effects as it results in reduced permeability and consequently reduced inductance.

Accordingly, there is a need for high quality inductors to be used in large scale CMOS integration. This provides a platform for the advancement of systems comprising highly granular dynamic voltage and frequency scaling as well as augmented energy efficiency. The present disclosure contemplates the novel fabrication of efficient and compact on-chip inductors and capacitors, practical methods for manufacturing thereof and remedying these and/or other associated problems.

SUMMARY

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings.

As mentioned above, the present invention relates to new and improved methods and apparatus for integrated inductors with interleaved windings. Specifically, the disclosed invention provides for inductors comprising coupled magnetic films and various conductor configurations to be manufactured using traditional semiconductor device fabrication techniques and equipment.

High permeability material is typically required to achieve the desired inductive properties on a small scale. According to one aspect of the present invention, inverse magnetic coupling between inductors in a multi-phase interleaved switched inductor power converter is used to avoid magnetic saturation.

Each of the coupled inductors carry an equal and opposite DC current component. The effects of the magnetic fields from the DC components which originate from each inductor oppose one another, thereby mitigating magnetic saturation. The present invention is particularly useful in switched inductor power converters, as it enables very high current densities.

According to one aspect of the invention, an integrated circuit comprises a ferromagnetic core, a first winding wrapping around said ferromagnetic core and a second winding wrapping around said ferromagnetic core; wherein, said first winding, said second winding and said ferromagnetic core are constructed during semiconductor device fabrication.

According to another aspect, said first and second windings are interleaved, at least in part. According to another aspect, said integrated circuit further comprises a second ferromagnetic core; wherein, said first and second winding wrap around both said first and second ferromagnetic cores. According to another aspect, said first and second windings are interleaved, at least in part.

According to another aspect of the invention, said first and second ferromagnetic cores are fabricated using thin-film technologies. According to another aspect, said first and second ferromagnetic cores further comprise laminated layers. According to another aspect, said ferromagnetic cores further comprise alternating, substantially insulating layers, interspersed therebetween.

According to another aspect, said first and second ferromagnetic cores are substantially rectangular in shape. According to another aspect, said first and second ferromagnetic cores further comprise a magnetically anisotropic material. According to another aspect, the hard axis of said magnetically anisotropic material is oriented to be magnetized by said first and second windings, at least in part.

According to another aspect, a single magnetic core is shaped in the form of a picture frame, racetrack oval or diamond. According to yet another aspect, additional windings can be added in a similar manner, being magnetically coupled to the other windings in the device.

According to another aspect, the thickness of said first and second ferromagnetic cores range between 1 and 10 μm in thickness. According to another aspect, the areas of said first and second ferromagnetic cores are less than 1 mm$^2$. According to another aspect, the inductance of the circuit is greater than 1 nH.

According to yet another aspect of the invention, the circuit is monolithically fabricated. According to another aspect, the circuit is fabricated using chip stacking technology.

According to another aspect, a method for fabricating an integrated, magnetically coupled inductor comprises the steps of patterning a bottom conductive layer; depositing first and second ferromagnetic cores on top of said bottom conductive layer; and, forming VIAs around, at least in part, said first and second ferromagnetic cores, whereby, said VIAs are in electrical communication with said bottom conductive layer.

The method for fabricating an integrated, magnetically coupled inductor further comprises the steps patterning a top conductive layer, whereby said top conductive layer is in electrical communication with said VIAs; and, providing an electrically insulating material between said first and second ferromagnetic cores, said VIAs and said bottom and top conductive layers, whereby, said VIAs and said bottom and top conductive layer create first and second inductive windings which wrap around, at least in part, said first and second ferromagnetic cores.

According to another aspect of the invention, the method further comprises interleaving said first and second inductive windings, at least in part. According to another aspect, the method further comprises depositing said first and second ferromagnetic cores in thin-film layers. According to another aspect, the method further comprises laminating electrically insulating material between said thin-film layers of said first and second ferromagnetic cores. According to another aspect, the method further comprises interleaving said first and second inductive windings, at least in part.

The present invention discloses a coupled inductor topology for a thin-film magnetic core power inductor that enables efficient integrated power conversion.

IN THE DRAWINGS

DETAILED DESCRIPTION

Figure 1:
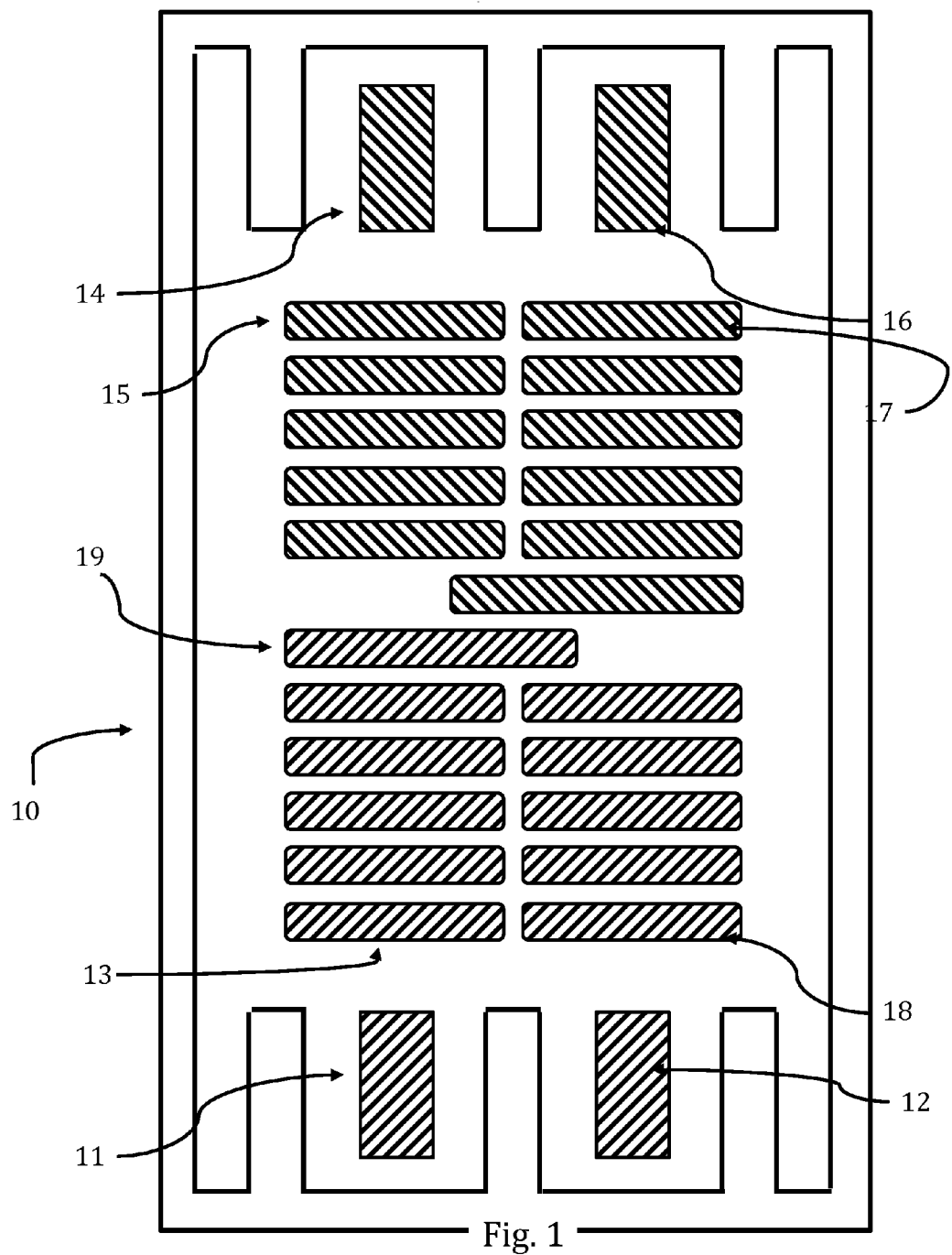
FIG. 1 illustrates an exemplary bottom conductive layout of an inductor.

As mentioned above, the present invention relates to the use of inverse magnetic coupling between inductors in a multi-phase interleaved switched inductor power converter to avoid magnetic saturation. In particular, the integration of coupled inductors with laminated magnetic film cores into semiconductor device fabrication or microelectronic applications.

One or more embodiments or implementations are hereinafter described in conjunction with the drawings, where like reference numerals are used to refer to like elements throughout, and where the various features are not necessarily drawn to scale.

The present invention discloses a novel inductor which can be integrated into large scale chip fabrication, according to one embodiment. Inductance is the property of a conductor by which a change in current in the conductor "induces" (creates) a voltage (electromotive force) in both the conductor itself (self-inductance) and in any nearby conductors (mutual inductance). These effects are derived from two fundamental observations of physics: First, that a steady current creates a steady magnetic field (Oersted's law), and second, that a time-varying magnetic field induces voltage in nearby conductors (Faraday's law of induction).

To add inductance to a circuit, electrical or electronic components called inductors are used. An inductor, also called a coil or reactor, is a passive two-terminal electrical component which resists changes in electric current passing through it. It consists of a conductor such as a wire, usually wound into a coil. When a current flows through it, energy is stored temporarily in a magnetic field in the coil. When the current flowing through an inductor changes, the time-varying magnetic field induces a voltage in the conductor, according to Faraday's law of electromagnetic induction, which opposes the change in current that created it.

Inductors increase their constituent magnetic fields by way of magnetic cores made of iron or ferrite inside the coil. A magnetic core can increase the inductance of a coil by a factor of several thousand, by increasing the magnetic field due to its higher magnetic permeability. However the magnetic properties of the core material cause several side effects which alter the behavior of the inductor which are described by the following and addressed by the present invention.

As discussed, a time-varying current in a ferromagnetic inductor produces a time-varying magnetic field in its core. Energy losses occur in the core material (core loss) due to magnetic field change which are dissipated as heat. Core losses arise in the based two conditions: eddy currents and hysteresis. A changing magnetic field induces circulating loops of electric current in the conductive metal core (Faraday's law). The currents dissipate into heat as a function of any nominal resistance associated with core material. The amount of energy loss is proportional to the area inside the loop of current.

Changing or reversing the magnetic field in the core also causes losses due to the motion of the tiny magnetic domains it is composed of. A magnetic domain is a region within a magnetic material which has uniform magnetization. Individual magnetic moments of the atoms are aligned with one another and they point in the same direction. Domains spontaneously form to minimize internal energy stored in the magnetic B-field.

The energy loss is proportional to the area of the hysteresis loop in the B-H graph of the core material. As such, "soft" core materials are chosen. Soft core metals have low coercivity and do not hold magnetic fields well after an external H-field is removed. Conversely, hard metals have high coercivity and are well suited as permanent magnets, as they resist changes in their magnetic fields following exposure to an external field to saturation.

In addition to low coercivity, appropriate core materials also comprise the property of high permeability. High permeability maximizes a generated flux density B for a given applied H-field. As a consequence, high inductor currents in a ferromagnetic core coil produces magnetic core saturation. Magnetic core saturation is a state reached when an increase in applied external magnetic field H cannot increase the magnetization of the material further, so the total magnetic flux density B levels off. Saturation stems from the magnetic moment alignment of a majority of the magnetic domains.

Inductors with ferromagnetic cores operate nonlinearly when the current through them is large enough to drive their core materials into saturation. This means that their inductance and other properties vary with changes in drive current. The present invention discloses the use of a DC current through a separate winding (coupled inductance) to control an inductor's impedance. Varying the current in the control winding moves the operating point up and down in the saturation curve, efficiently controlling the AC current through the inductor.

In the present invention, laminations of soft magnetic materials are integrated with other electronic circuits on a single, or multiple semiconductor substrates, in order to improve inductance, or provide additional functionality that would not otherwise be available on an integrated circuit. Specifically, the integration of magnetic films enables efficient switched inductor power conversion. The laminated magnetic film is magnetically coupled to a coil that is composed of one or more layers of electrical conductor, in order to provide a high quality inductance with low resistance through the conductive element.

FIG. 1 illustrates an exemplary bottom conductive layout 10 of an non-interleaved inductor, according to one embodiment. Bottom conductive layout 10 comprises primary pads 14, 16, secondary pads 11, 12, primary windings 15, 17 and secondary windings 13, 18, 19. Bottom conductive layout 10 is made of a conductive material disposed on silicon wafer. Its fabrication is implemented during back end of the line (BEOL) processing.

BEOL processing involves creating metal interconnecting wires that are isolated by dielectric layers. The insulating material is typically silicon dioxide ($SiO_2$) or a silicate glass. A lower layer is Pre-Metal dielectric (PMD) can be laid out with subsequent chemical-mechanical polishing (CMP) to isolate metal from silicon and polysilicon. Bottom conductive layout 10 is produced on top of the insulator/dielectric using the same semiconductor techniques as metal wires/traces comprising aluminum or copper.

That is, during wiring (e.g., subtractive aluminum or copper) blanket films of aluminum/copper are deposited first, patterned, and then etched, leaving isolated wires. In the present embodiment, etching would leave the bottom conductive layout 10 exposed. In other embodiments, the conductive elements 11-19 are etched, at least in part, in the insulating material and then conductive material (e.g., tungsten) is deposited in the holes using chemical vapor deposition (CVD) techniques, or a combination of CVD and electroplating.

Primary pads 14, 16 are in electrical communication with primary windings 15, 17, respectively. Their pathways will be discussed in greater detail later in the disclosure. Similarly, secondary pads 11, 12 are in electrical communication with secondary windings 13, 18, respectively. Secondary winding 13 is electrically conductive to secondary winding 18 though secondary winding 19. All are comprised by the one side of a secondary inductive coil.

Figure 2:
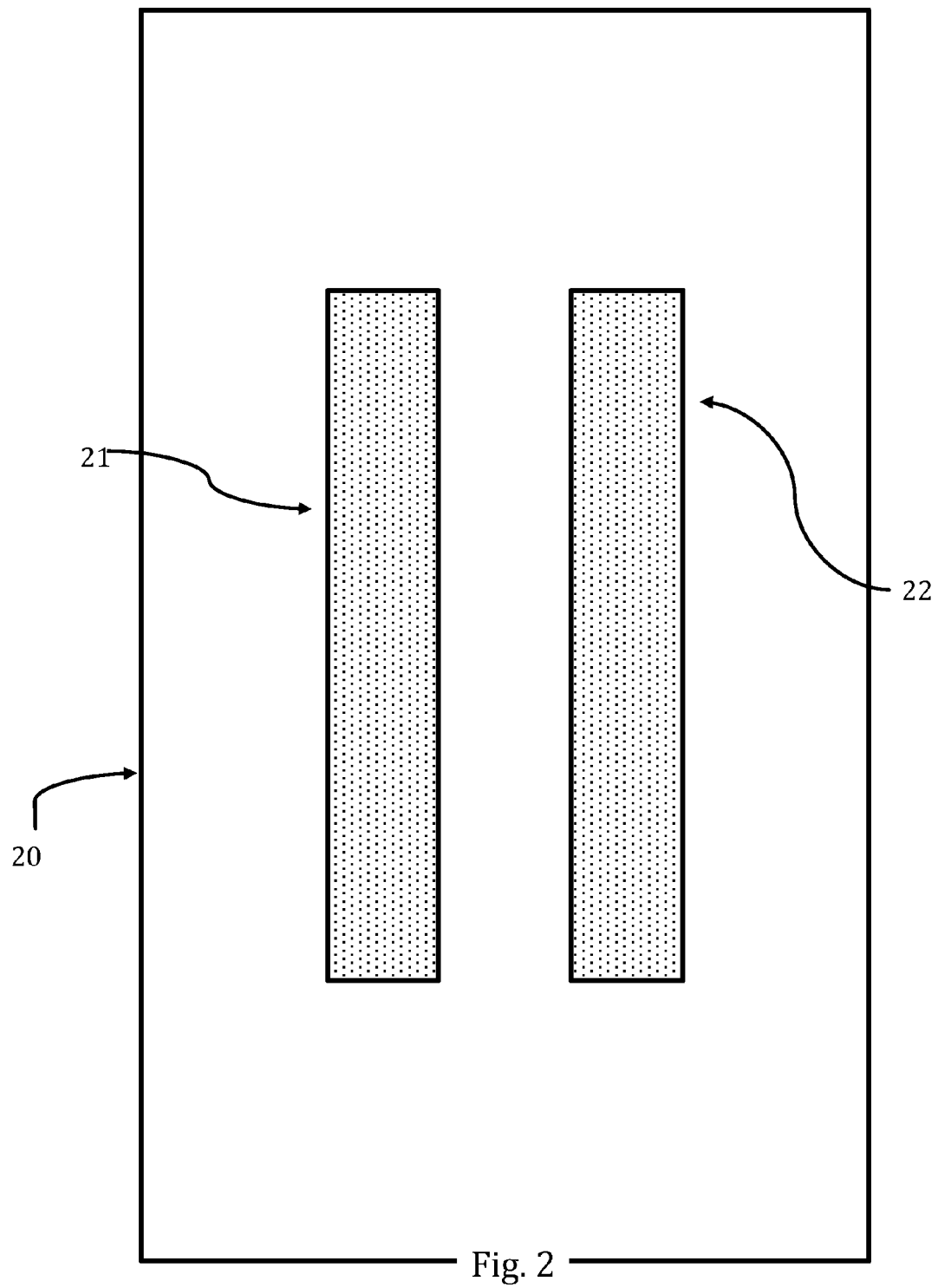
FIG. 2 depicts an exemplary magnetic core layout of two inductors.

FIG. 2 depicts an exemplary magnetic core layout 20 of an non-interleaved inductor. Magnetic core layout comprises magnetic cores 21, 22 and is created by first laying out a dielectric layer on top of bottom conductive layer. Rectangular magnetic cores 21, 22 are patterned and fabricated using thin-film processing techniques.

Dimensionally, magnetic cores 21, 22 are between 1 μm and 100 μm in thickness. Less than 1 μm is too small to have a significant impact on magnetic flux and consequently inductance, while greater than 100 μm is too thick to process in a practical amount of time using conventional fabrication techniques. In one embodiment, magnetic cores 21, 22 are between 1 μm and 10 μm, as this range is most practical for conventional fabrication techniques. Thicker films result in greater inductance values and higher saturation tolerances for a given inductive coil current.

Magnetic cores 21, 22 comprise soft ferromagnetic materials. Soft ferromagnetic materials have a number of useful applications within circuits and microelectronic applications. They exhibit high permeability and low coercivity; two properties that are useful for enhancing inductance.

Methods and techniques are used to ensure that the high permeability and low coercivity of the material are maintained over specific ranges of frequency and applied magnetic field strengths. These techniques are also employed to suppress the formation of eddy currents and minimize other loss mechanisms over potential operating conditions.

Soft ferromagnetic materials are also good conductors, and a core made from such a material also constitutes a single short-circuited turn throughout its entire length. Eddy currents therefore circulate within the core in a plane normal to the flux. They are a major source of power loss at high frequencies via resistive heating of the core material.

In one or more embodiments, magnetic film layers are deposited sequentially with electrically insulating layers laminated therebetween. This functions to suppress eddy currents particularly in high frequency switching applications. Insulation layers range from 1 nm to 500 nm in thickness and electrically isolated two or more magnetic laminations.

An electrical insulator is a material whose internal electric charges do not flow freely. An electrical insulator, therefore, does not conduct an electric current under the influence of an electric field. It is characterized by a low conductivity/high resistivity. In one or more embodiments, electrically insulating layers comprises photoresist, metal oxide, silicon dioxide, polymer or other suitable material suitably used in semiconductor device fabrication.

Figure 3:
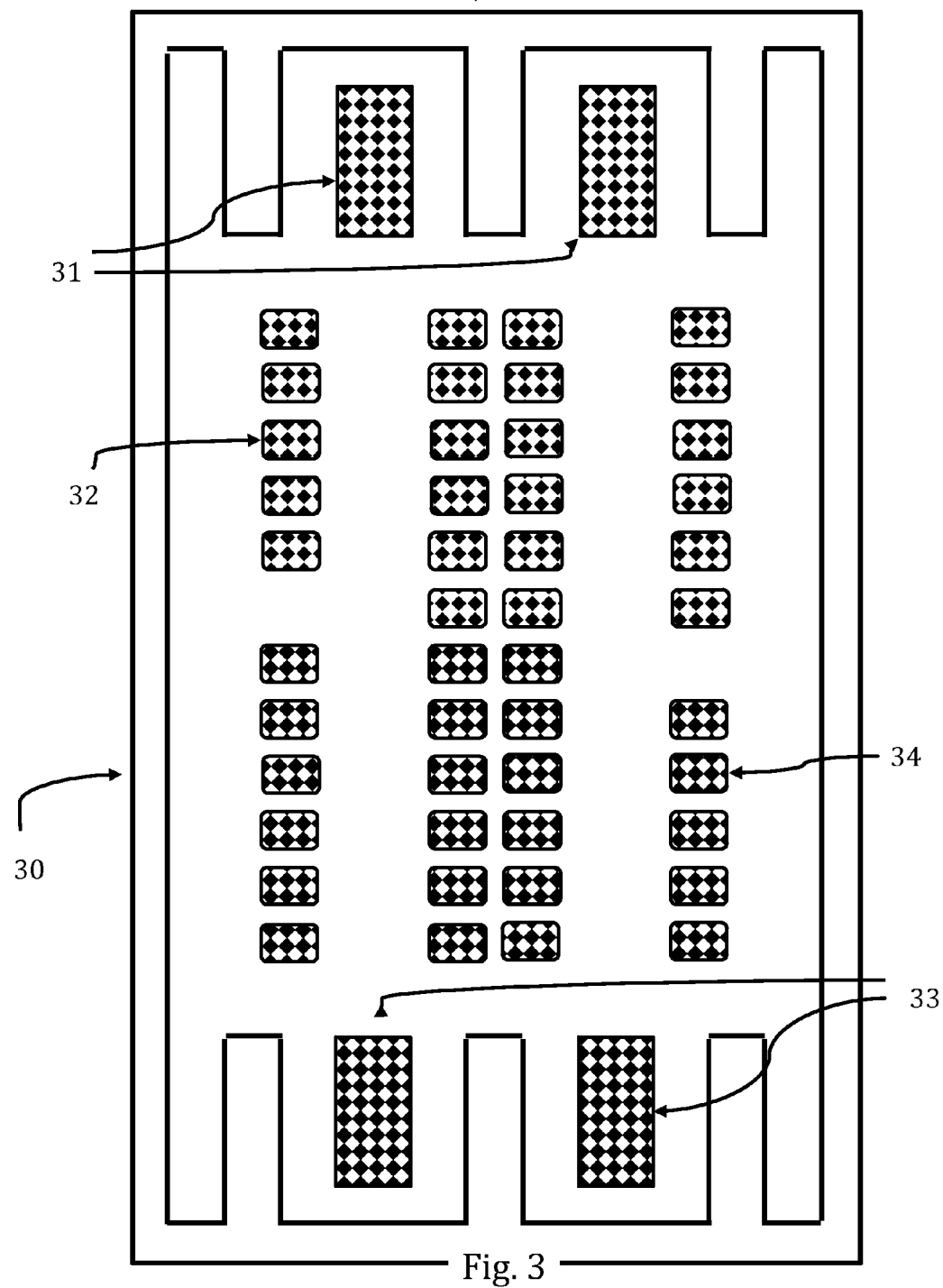
FIG. 3 illustrates an exemplary vertical interconnect conductive layout of an inductor.

FIG. 3 illustrates an exemplary vertical interconnect conductive layout 30 of an ferromagnetic core inductor. It is helpful to view FIG. 3 as an overview of the layout of FIG. 1, as the elements of the bottom conductive layout 10 are in electrical communication with elements of vertical interconnect conductive layout 30. Vertical interconnect conductive layout 30 comprises primary terminal vertical interconnect accesses (VIAs) 31, secondary terminal VIAs 33, primary coil VIAs 32 and secondary coil VIAs 34.

In integrated circuit design, a VIA is a small opening in an insulating oxide layer that allows a conductive connection between different layers. In one embodiment, the vertical interconnect conductive layout 30 is fabricated by laying Intra-Metal dielectric over magnetic core layout 20. VIA holes are patterned and etched through dielectric. VIA holes are filed with metal using CVD or other suitable process to connect bottom conductive layout 10.

Crosshatchings of FIGS. 1, 3 demonstrate interconnectivity between the layers and electrical conductivity between elements on the same level. For example, primary terminal VIAs 31 and secondary terminal VIAs 33 electrically connect to primary pads 14, 16 and secondary pads 11, 12, respectively, but are electrically isolated from one another (that is, primary and secondary). The elements are, in fact, magnetically coupled together. Of which, this functionality will be discussed in detail later in the disclosure. Similarly, primary coil VIAs 32 and secondary coil VIAs 34 electrically connect to primary windings 15, 17 and secondary winding 13, 18, respectively.

Figure 4:
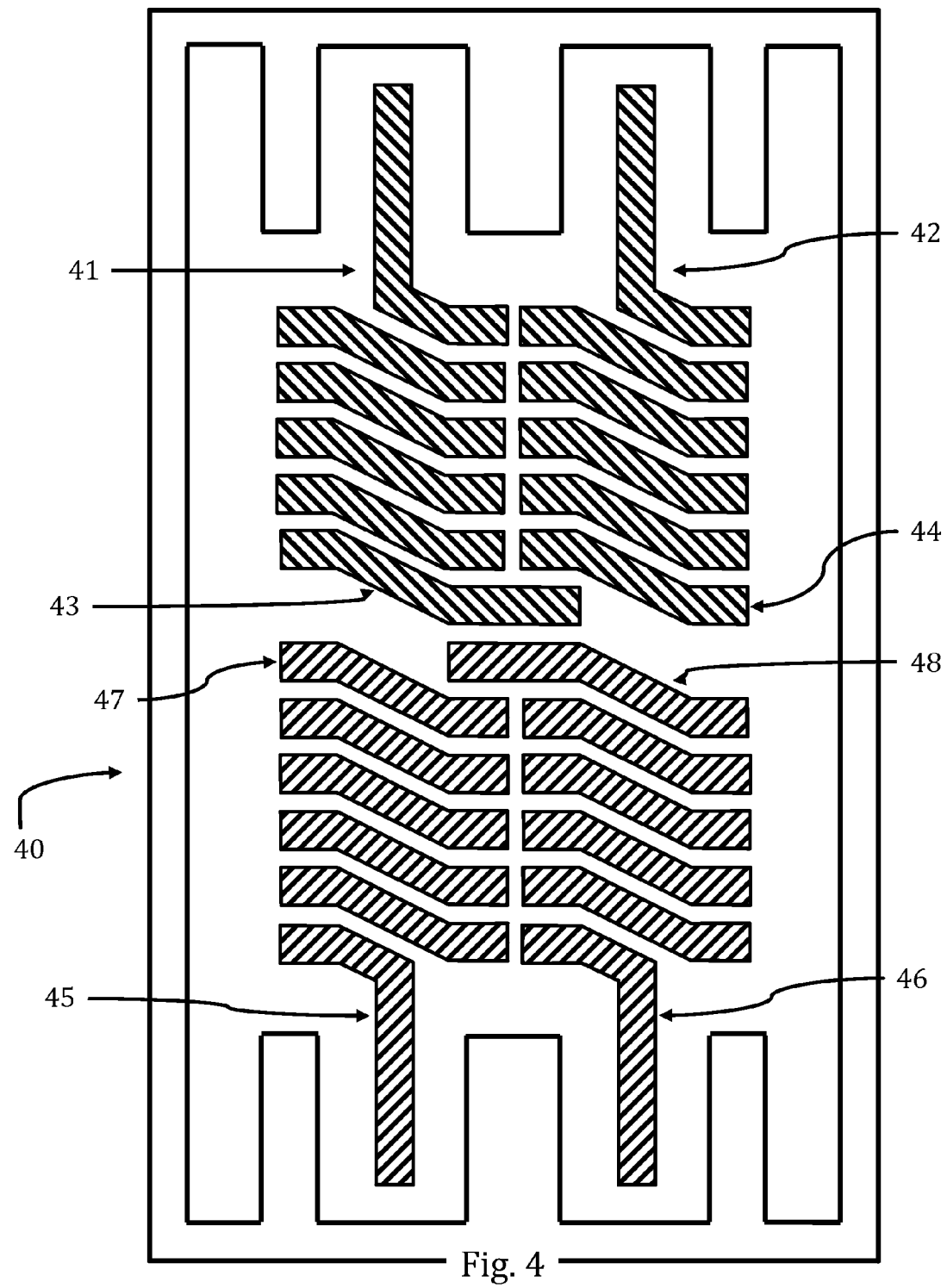
FIG. 4 illustrates an exemplary top conductive layout of an inductor.

FIG. 4 illustrates an exemplary top conductive layout 40 of a magnetic core inductor with non-interleaved windings. It is demonstrative to analyze FIG. 4, in view of FIGS. 1 and 3, as they are complementary to one another. Top conductive layout 40 comprises primary terminals 41, 42, secondary terminals 45, 46, primary windings 43, 44 and secondary windings 47, 48. Top conductive layout 40 is made from conductive material (e.g., copper, aluminum etc.) disposed on top of (over) magnetic core layout 20 and vertical interconnect layout 30.

Top conductive layout 40 is produced on top of the insulator/dielectric ($SiO_2$ or other low-K material) using the same semiconductor techniques as metal wires/traces comprising aluminum or copper. Using subtractive aluminum techniques, blanket films of aluminum are deposited first, patterned, and then etched, leaving isolated elements of the top conductive layout 40.

In the present embodiment, etching would leave the top conductive layout 40 exposed. In other embodiments, the conductive elements 41-48 are etched, at least in part, in the insulating material and then conductive material is deposited in the holes using CVD, plasma vapor deposition (PVD), electroplating techniques or other suitable method.

Pursuant to FIG. 4 illustration, primary terminals 41, 42 are electrically connected to primary windings 43, 44, respectively. The electrical pathway begins at primary terminal 42 and continues onto the proximal end of primary winding 43. Distal ends of primary windings 43, 44 are electrically connected, thus allowing the pathway to continue to proximal end of primary winding 44 onto to primary terminal 42. Of course, directionality is arbitrary, and the electrical pathway could just as well be described at beginning at primary terminal 42. The primary components are comprised by the primary inductive coil.

Similarly, secondary terminals 45, 46 are electrically connected to secondary windings 47, 48, respectively. The secondary electrical pathway begins at secondary terminal 45 and continues onto the proximal end of secondary winding 47. Distal ends of secondary windings 47, 48 are electrically connected, thereby allowing the pathway to continue to proximal end of secondary winding 48 and terminating at secondary terminal 46. The aforementioned secondary components are comprised by the secondary inductive coil, which is also bi-directional.

Figure 5:
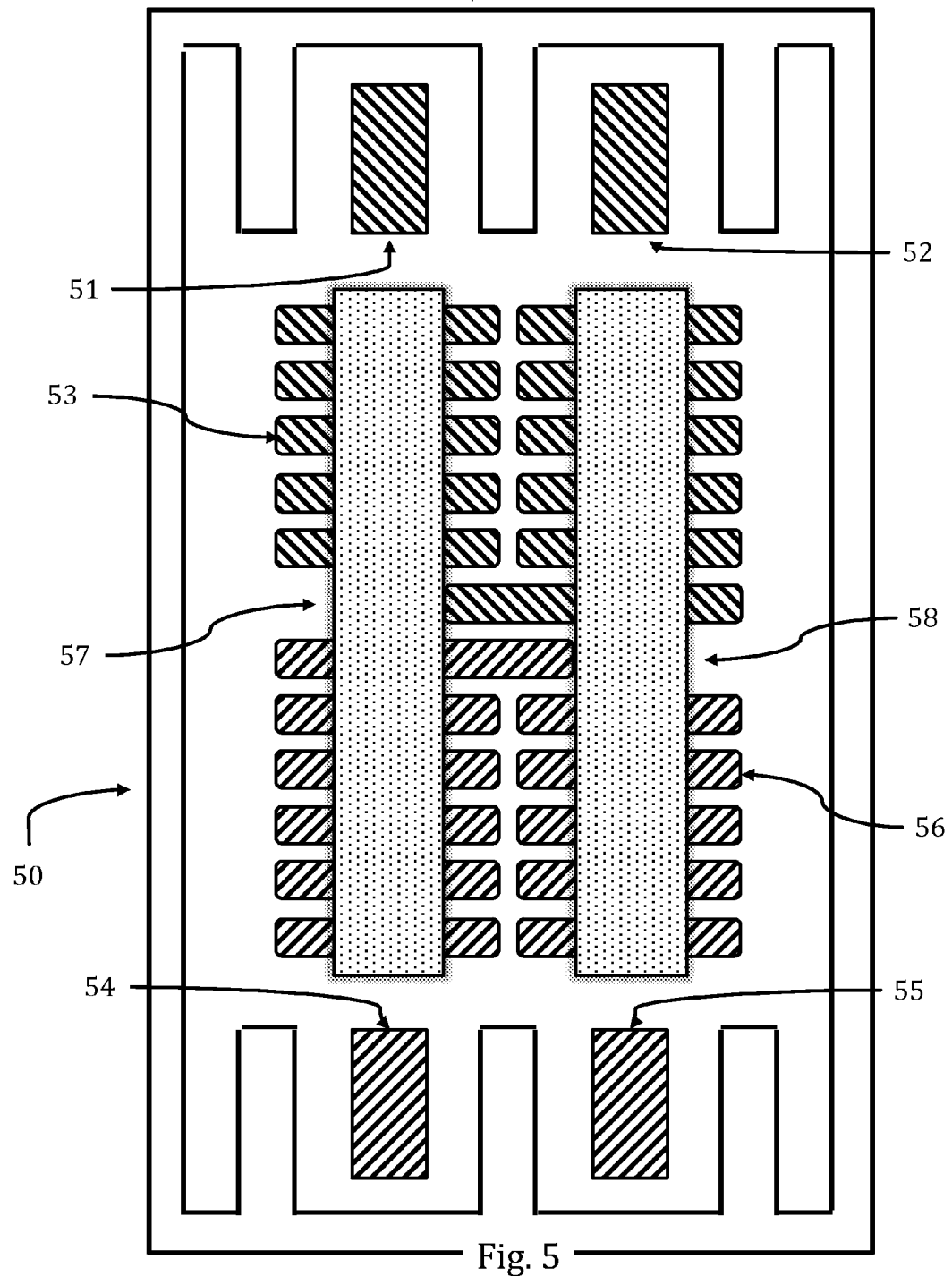
FIG. 5 illustrates an exemplary inductor using juxtaposed conductive and magnetic core layouts.

FIG. 5 illustrates an exemplary non-interleaved, coupled inductor 50 using conductive and magnetic core layout overlays. Congruous with the discussion associated with FIG. 2, magnetic cores 57, 58 are patterned in shapes resembling rectangles. Designed to carry electrical current, primary and secondary windings 53, 56 wrap around both magnetic cores 57, 58. Magnetic core material has a permeability greater than free space $\mu_0$, thereby improving the inductance of the device by offering a low reluctance path for the magnetic flux that is induced by current in the windings.

Primary and secondary windings 53, 56 have primary and secondary electrical terminals 51-52, 54-55, respectively, which deliver current into and out of the device. Primary and secondary windings 53, 56 comprise a series of loops formed by an electrically conductive material. Primary winding 53 loops around one half of magnetic cores 57, 58 enabling magnetic coupling amongst the three elements. Secondary winding 56 loops around the other half of magnetic cores 57, 58. This, in turn, magnetically couples secondary winding 56 to magnetic cores 57, 58 and by extension, to primary winding 53.

Primary and secondary windings 53, 56 are fabricated using thin-film processing techniques and are generally limited to 1 µm to 100 µm in thickness. Less than 1 µm results in conducting layers that are too resistive, while greater than 100 µm is too thick to process in a practical amount of time using conventional fabrication techniques. In a preferred embodiment, primary and secondary windings 53, 56 are between 5 µm to 10 µm. This range is suitable for conventional fabrication techniques, although thicker films afford lower resistivity.

Primary and secondary windings 53, 56 are constructed so that for a given DC current traveling through either winding, the orientation of the induced magnetic flux in adjacent magnetic cores 57, 58 are opposite. Thus, a single magnetic flux path is formed, disregarding polarity. One in the art will appreciate that such an arrangement gives rise to magnetic field lines which originate in the top of magnetic core 57 terminate in the top of magnetic core 58, at least in part. Conversely, magnetic field lines which originate in the bottom of magnetic core 57 terminate in the bottom of magnetic core 58 with respect to field lines proximal to one another.

This foregoing configuration augments inductance because the reluctance of a magnetic flux path travels through two magnetic cores (57, 58) is less than can be achieved with a device with a single magnetic core. It also reduces the magnitude of stray magnetic fields which originate from currents traveling through primary and secondary terminals 51-52, 54-55, respectively, especially terminals proximal to one another. For example, the magnetic field produced by current passing through primary terminal 51 (Ampere's law) is partially cancelled by current traveling the in opposite direction of primary terminal 52 in an area between the two leads.

In operation, inverse magnetic coupling is employed to avoid magnetic saturation. Specifically, high currents in the primary winding 53 threaten to saturate magnetic cores 57, 58. This can be mitigated and carefully controlled by passing a DC current through secondary winding 56 such that the induced magnetic field is counter in polarity to that induced by primary winding 53. This is a particularly valuable procedure in switched inductor power converters, as it affords very high current densities.

In one embodiment, the DC components of the signals traveling through primary and secondary windings 53, 56 are equal and opposite to one another. Effectively, this is akin to removing the DC offset of the signal allowing the AC to be affected by the inductance. In another embodiment, the magnitude of the DC current in the secondary winding 56 is less than that of the primary 53 but disposes the coupled inductor just below saturation, thereby maximizing magnetic flux and inductance. This is analogous to biasing an amplifying transistor in its linear region. In yet another embodiment, negative feedback is provided through the secondary winding 56, thereby accurately controlling and manipulating any desired inductance—including linear.

Figure 6:
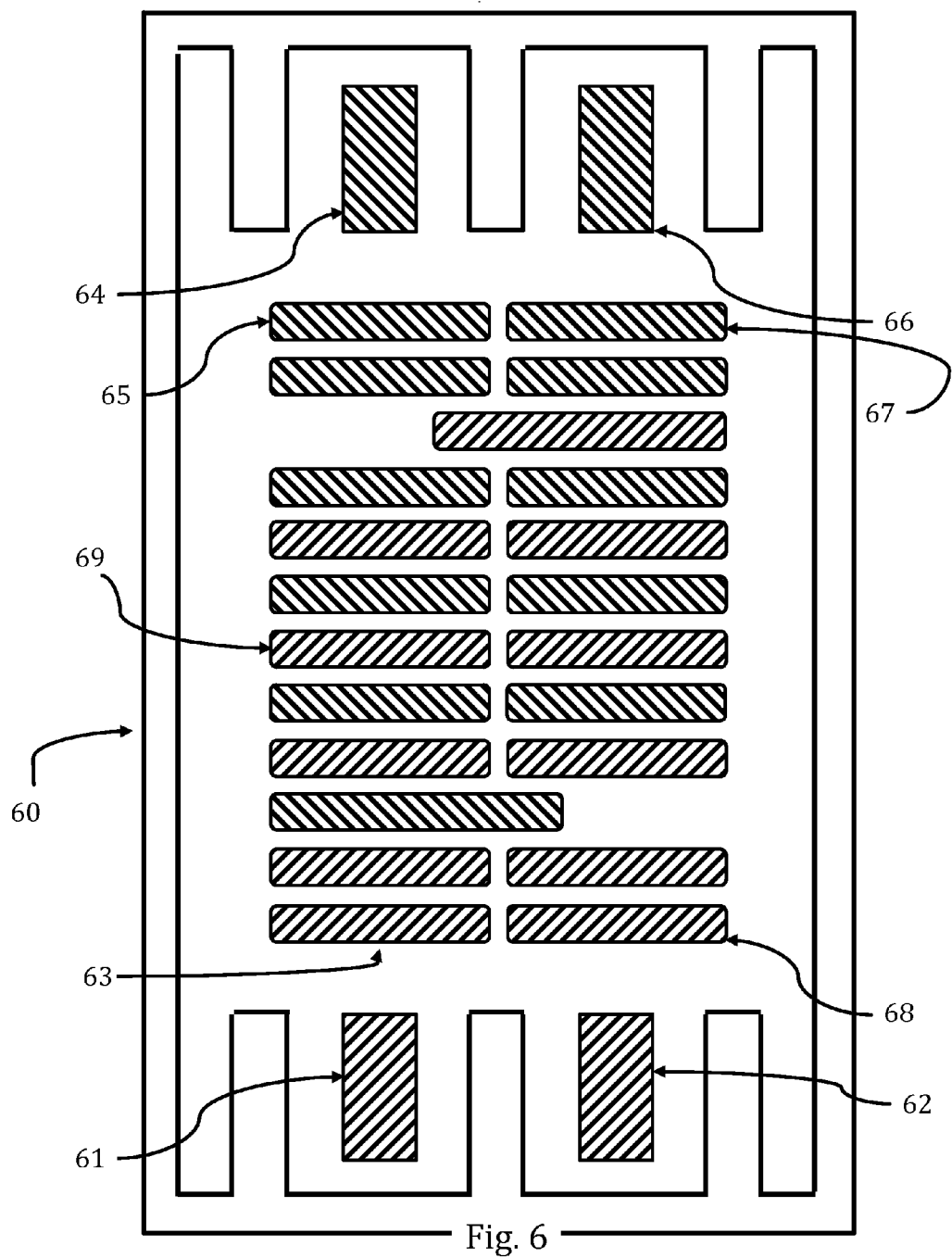
FIG. 6 illustrates an exemplary bottom conductive layout of an inductor.

FIG. 6 illustrates an exemplary bottom conductive layout 60 of a partially interleaved inductor, according to another embodiment. Bottom conductive layout 60 comprises primary pads 64, 66, secondary pads 61, 62, primary windings 65, 67, secondary windings 63, 68 and interleaved winding 69. Bottom conductive layout 60 is made of a conductive material disposed on silicon wafer. Its fabrication is implemented during back end of the line (BEOL) processing.

Bottom conductive layout 60 is produced on top of the insulator/dielectric using the same semiconductor techniques as metal wires/traces comprising aluminum. Blanket films of aluminum are deposited first, patterned, and then etched, leaving isolated wires. In the present embodiment, etching would leave the bottom conductive layout 60 exposed. In other embodiments, the conductive elements 61-69 are etched, at least in part, into the insulating material and then conductive material is deposited in the holes using CVD.

Primary pads 64, 66 are in electrical communication with primary windings 65, 67, respectively. Their pathway will be discussed in greater detail later in the disclosure. Similarly, secondary pads 61, 62 are in electrical communication with secondary windings 63, 68, respectively. Secondary winding 63 is electrically conductive to secondary winding 68 though interleaved winding 69. Interleaved winding 69 comprises alternating loops from the primary and secondary coils, as demonstrated by interchanging crosshatching in FIG. 6.

Figure 7:
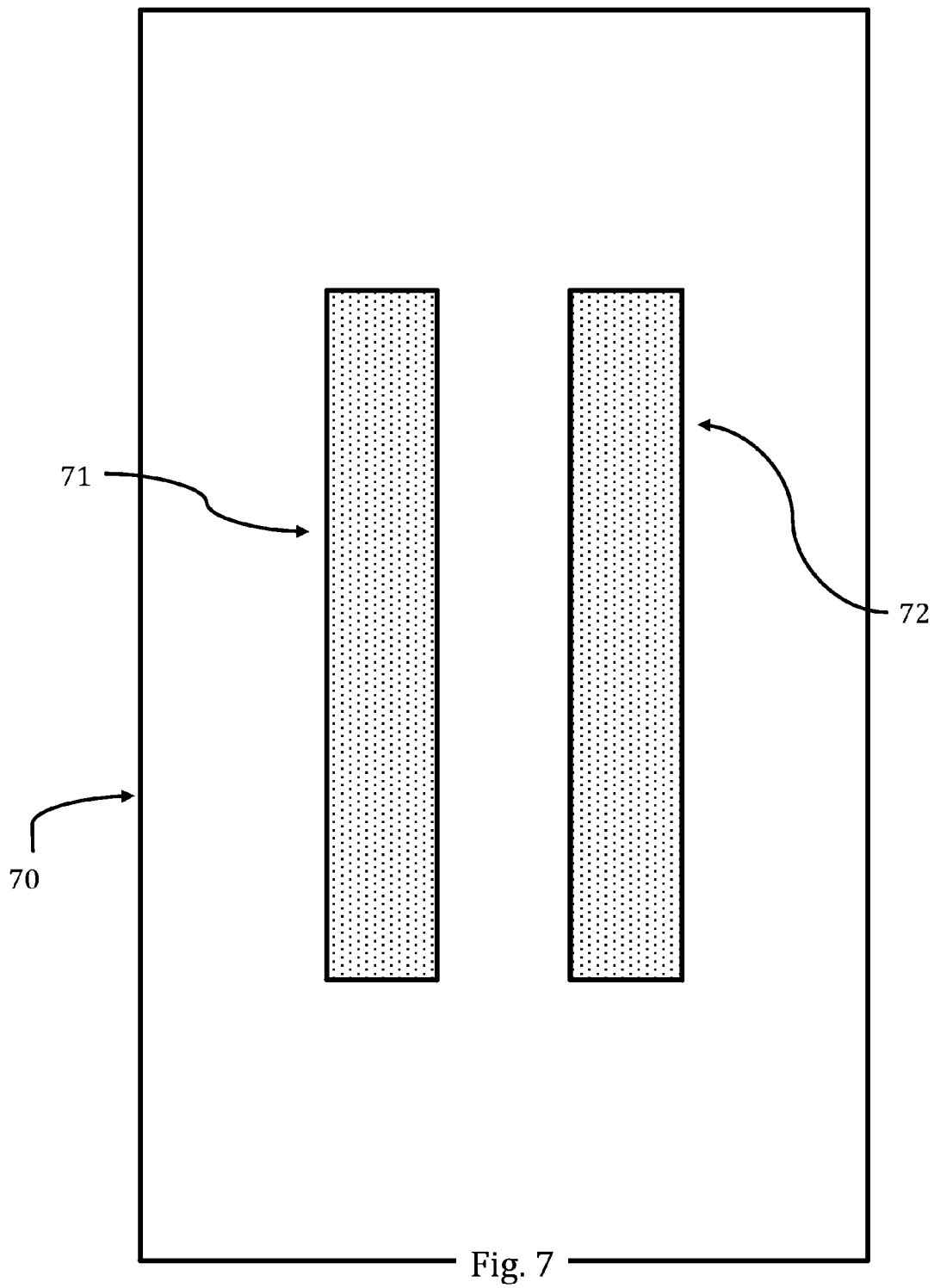
FIG. 7 depicts an exemplary magnetic core layout of an inductor.

FIG. 7 depicts an exemplary magnetic core layout 70 of an inductor. Magnetic core layout comprises magnetic cores 71, 72 and is created by first laying out a dielectric layer on top of bottom conductive layer. Rectangular magnetic cores 71, 72 are patterned and fabricated using thin-film processing techniques.

In accordance with the aforementioned description, magnetic cores 71, 72 are preferably dimensioned between 1 µm and 10 µm in thickness. Magnetic cores 71, 72 comprise soft ferromagnetic materials. In one or more embodiments, magnetic film layers deposited sequentially with electrically insulating layers laminated therebetween. This functions to suppress eddy currents particular in high frequency switching applications. Insulation layers are range from 1 nm to 500 nm in thickness and electrically isolated two or more magnetic laminations.

Figure 8:
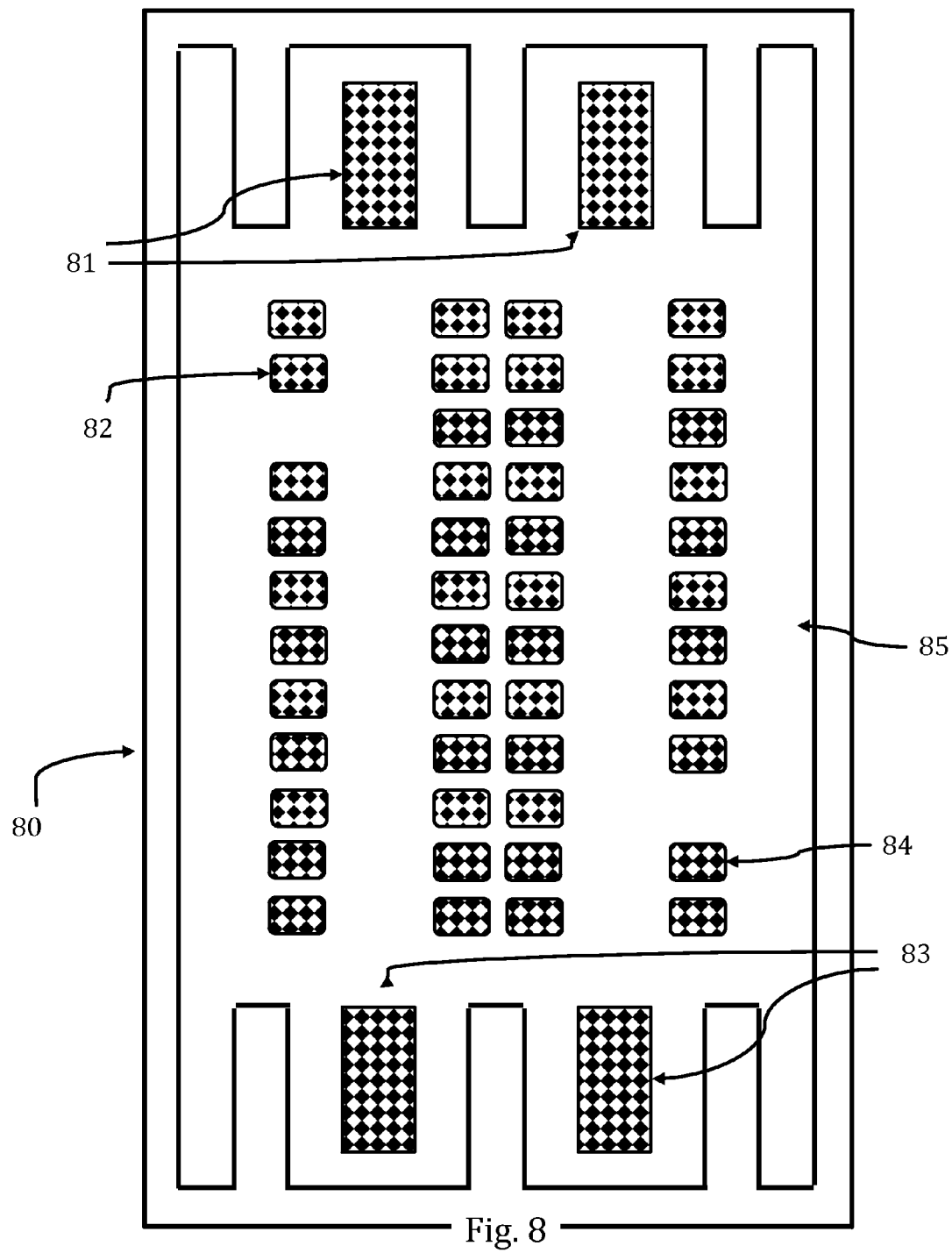
FIG. 8 illustrates an exemplary vertical interconnect conductive layout of an inductor.

FIG. 8 illustrates an exemplary vertical interconnect conductive layout 80 of an ferromagnetic core inductor. It is helpful to view FIG. 8 as an overview of the layout of FIG. 6, as the elements of the bottom conductive layout 60 are in electrical communication with elements of vertical interconnect conductive layout 80. Vertical interconnect conductive layout 80 comprises primary VIAs 81, secondary terminal VIAs 83, primary coil VIAs 82, secondary coil VIAs 84 and interleaved coil VIAs 85.

In one embodiment, the vertical interconnect conductive layout 80 is fabricated by laying Intra-Metal dielectric over magnetic core layout 70. VIA holes are patterned and etched through dielectric. VIA holes are filed with metal using CVD or other suitable process to connect bottom conductive layout 60. Crosshatchings of FIGS. 6, 8 demonstrate interconnectivity between the layers and electrical conductivity between elements on the same level. For example, primary terminal VIAs 81 and secondary terminal VIAs 83 electrically connect to primary pads 64, 66 and secondary pads 61, 62, respectively, but are electrically isolated from one another (that is, primary and secondary).

Interleaved coil VIAs 85 strengthen magnetically coupling, which will be discussed in detail later in the disclosure. Similarly, primary coil VIAs 82 and secondary coil VIAs 84 electrically connect to primary windings 65, 67 and secondary winding 63, 68, respectively. Interleaved coil VIAs 85 connect to interleaved winding 69.

Figure 9:
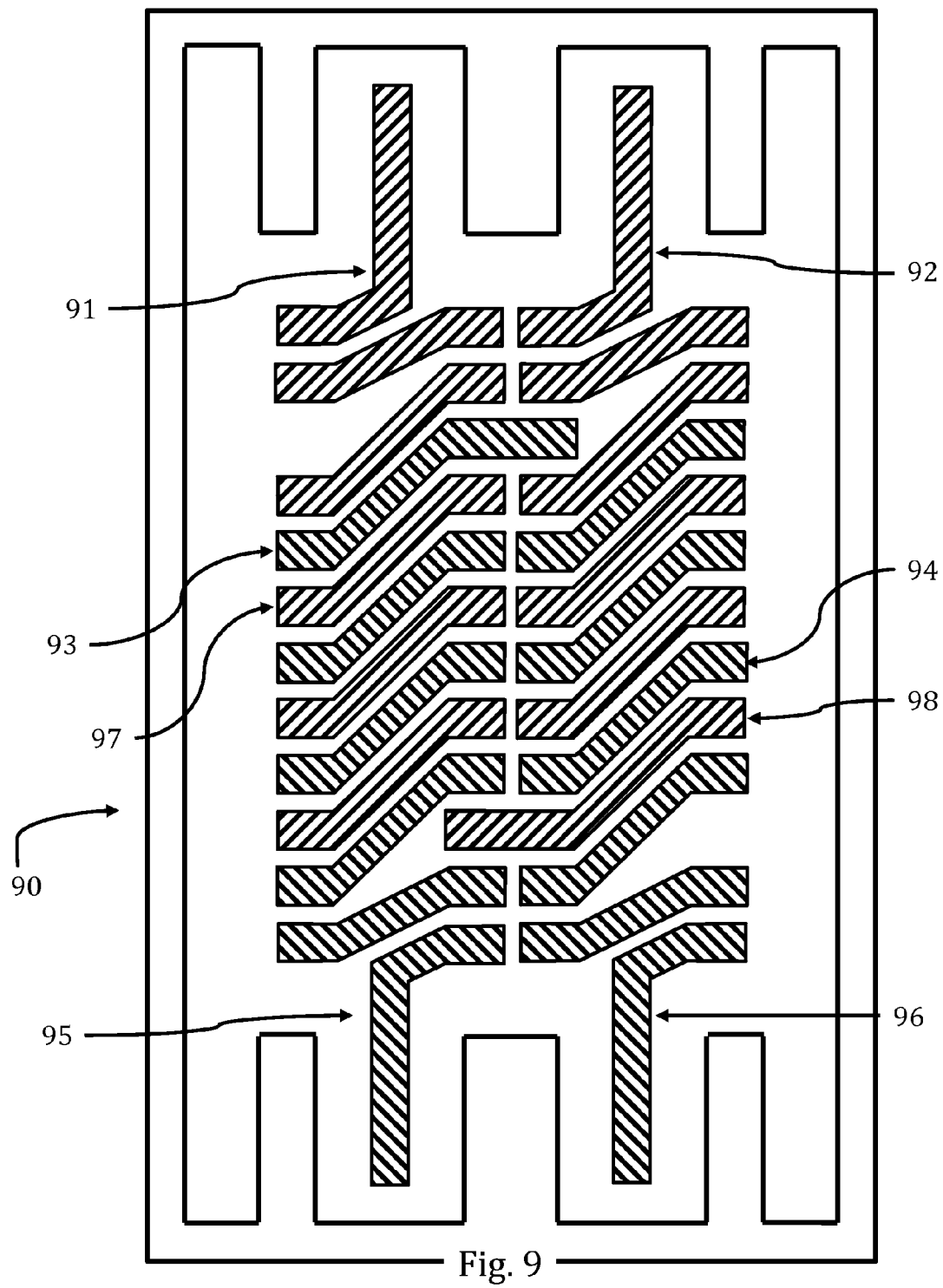
FIG. 9 illustrates an exemplary top conductive layout of an inductor.

FIG. 9 illustrates an exemplary top conductive layout 90 of a partially interleaved, magnetic core inductor. It is demonstrative to analyze FIG. 9, in view of FIGS. 6 and 8, as they are complementary to one another. Top conductive layout 90 comprises primary terminals 91, 92, secondary terminals 95, 96, primary winding 97, secondary winding 94, primary crossover loop 98 and secondary crossover loop 93. Top conductive layout 90 is made from conductive material (e.g., copper, aluminum etc.) disposed on top of (over) magnetic core layout 70 and vertical interconnect layout 80.

Primary terminals 91, 92 loop a few times (i.e., partially interleaved) before primary winding 97 alternatingly interleaving with secondary winding 94. The two interleaved sections of the primary coil are electrically connected through primary crossover loop 98, completing the electrical pathway. Similarly, secondary terminals 95, 96 loop a few times before secondary winding 94 alternatingly interleaving with primary winding 97. The two interleaved sections of the secondary coil are electrically connected through secondary crossover loop 93, completing the electrical pathway.

Figure 10:
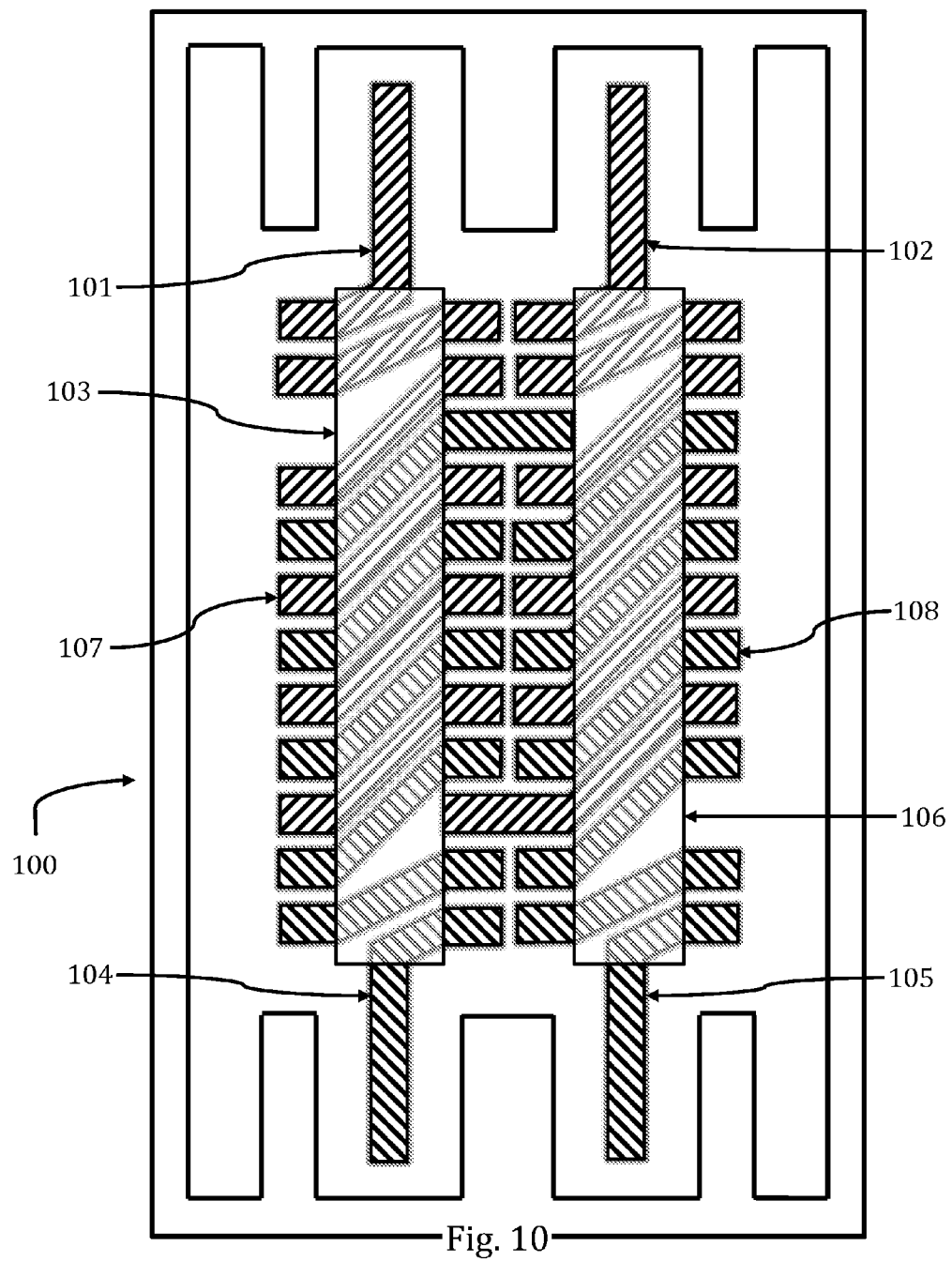
FIG. 10 illustrates an exemplary inductor using juxtaposed conductive and magnetic core layouts.

FIG. 10 illustrates an exemplary partially interleaved, coupled inductor 100 using conductive an magnetic core layout overlays, according to another embodiment of the present invention. Consistent with the discussion associated with FIGS. 2, 7, magnetic cores 103, 106 are patterned in shapes resembling rectangles. Designed to carry electrical current, primary and secondary windings 107, 108 wrap around both magnetic cores 103, 106. Magnetic core material has a permeability greater than free space $\mu_o$, thereby improving the inductance of the device by offering a low reluctance path for the magnetic flux that is induced by current in the windings.

Primary and secondary windings 107, 108 have primary and secondary electrical terminals 101-102, 104-105, respectively, which deliver current into and out of the device. Primary and secondary windings 107, 108 comprise a series of interleaving loops, at least in part, which are formed by an electrically conductive material. Primary winding 107 loops around a majority of magnetic cores 103, 106 enabling magnetic coupling amongst the three elements. Secondary winding 108 loops around a majority of a complementary section of magnetic cores 103, 106. In turn, magnetically couples secondary winding 108 to magnetic cores 103, 106, and by extension, to primary winding 107.

Primary and secondary windings 107, 108 are fabricated compliant to prior discussion using thin-film processing techniques. Primary and secondary windings 103, 106 are constructed so that for a given DC current traveling through either winding, the orientation of the induced magnetic flux in adjacent magnetic cores 103, 106 are opposite. The configuration enhances inductance because the reluctance of a magnetic flux path travels through two magnetic cores is less than can be achieved with a device with a single magnetic core.

In operation, inverse magnetic coupling is employed to avoid saturation. Specifically, high currents in the primary winding 107 threaten to saturate magnetic cores 103, 106. This can be mitigated and carefully controlled by passing a DC current through secondary winding 106 such that the induced magnetic field in counter in polarity induced by primary winding 107. The extent to which the windings are interleaved is controlled during the design of the device to control the amount of coupling between the device windings.

Figure 11:
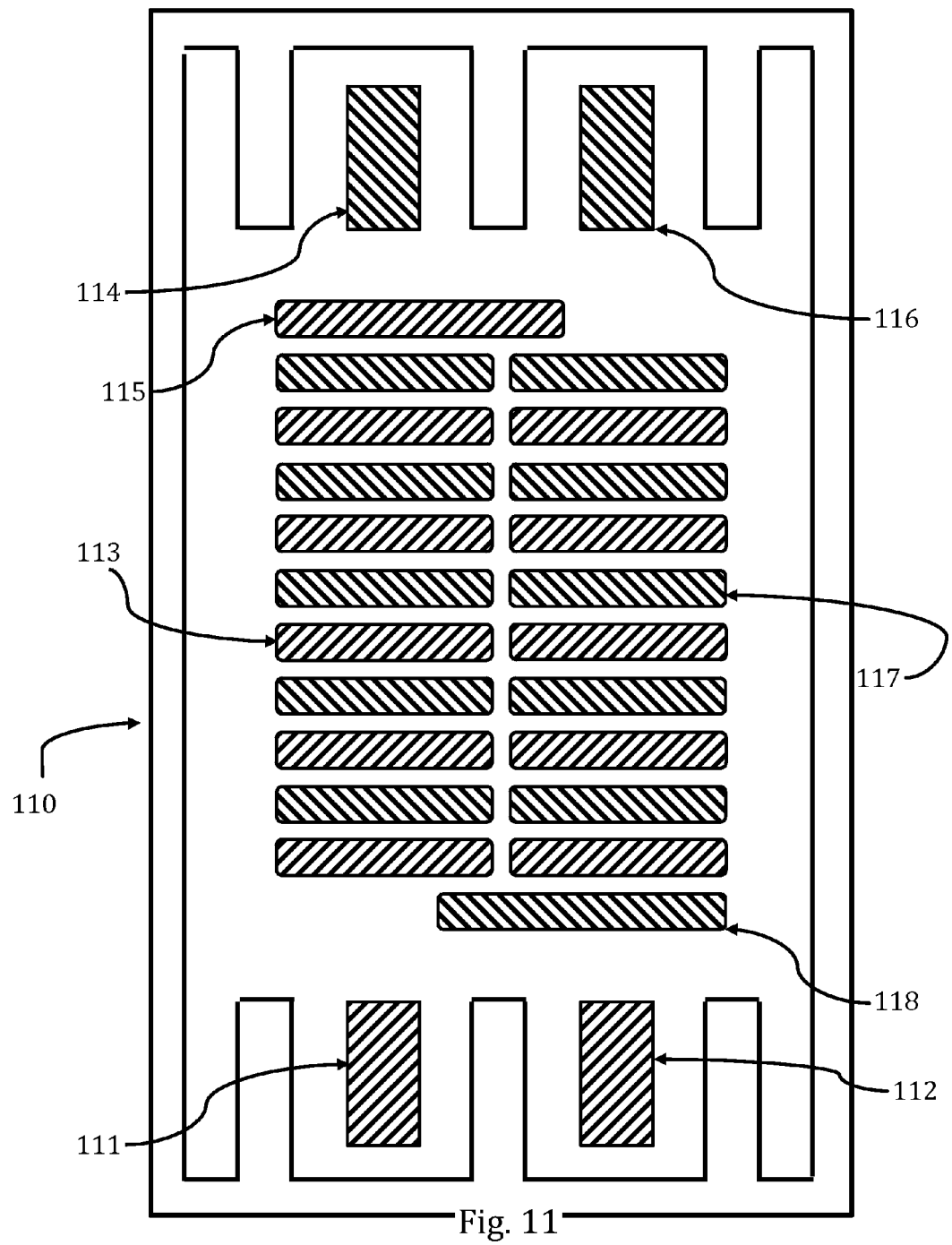
FIG. 11 illustrates an exemplary bottom conductive layout of an inductor.

FIG. 11 illustrates an exemplary bottom conductive layout 110 of a fully interleaved inductor, according to another embodiment of the present invention. Bottom conductive layout 110 comprises primary pads 114, 116, secondary pads 111, 112, primary windings 117, 118, secondary windings 113, 115. Bottom conductive layout 110 is fabricated consistent with prior description. Primary pads 114, 116 are in electrical communication with primary windings 117, 118, respectively. Similarly, secondary pads 111, 112 are in electrical communication with secondary windings 113, 115, respectively. Primary and secondary windings 117, 113 interleave one another throughout the entire length of the primary and secondary coils, as demonstrated by interchanging crosshatching in FIG. 11.

Figure 12:
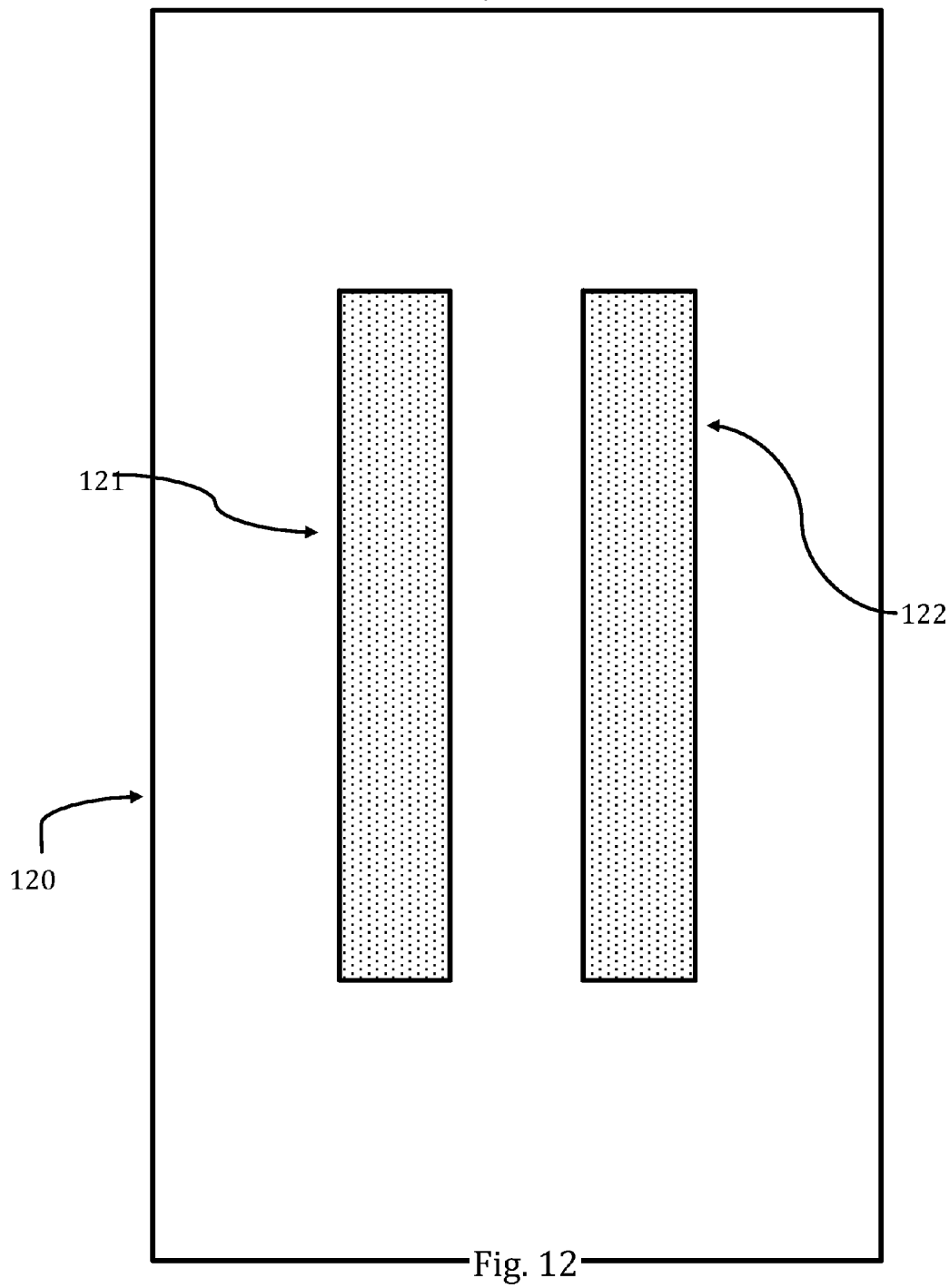
FIG. 12 depicts an exemplary magnetic core layout of an inductor.

FIG. 12 depicts an exemplary magnetic core layout 120 of an inductor. Magnetic core layout comprises magnetic cores 121, 122 and is created by first laying out a dielectric layer on top of bottom conductive layer. Rectangular magnetic cores 121, 122 are patterned and fabricated using thin-film processing techniques and are preferably dimensioned between 1 μm and 10 μm in thickness.

Figure 18:
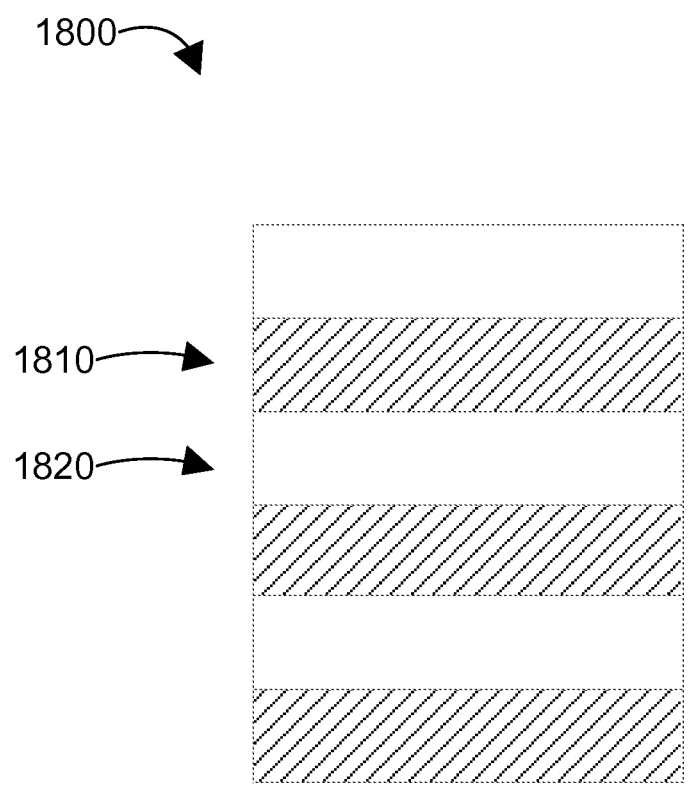
FIG. 18 illustrates a cross section of a laminated magnetic core 1800 according to an embodiment.

Magnetic cores 121, 122 comprise soft ferromagnetic materials. In one embodiment, magnetic film layers deposited sequentially with electrically insulating layers laminated therebetween. This functions to suppress eddy currents particular in high frequency switching applications. Insulation layers can range from 1 nm to 500 nm in thickness and electrically isolated two or more magnetic laminations. FIG. 18 illustrates a cross section of a laminated magnetic core 1800 according to an embodiment. The magnetic core 1800 includes a laminated structure of alternating magnetic film layers 1810 and insulation layers 1820.

In another embodiment, magnetic core 121, 122 comprise a magnetically anisotropic material. Suitable soft magnetic materials comprise alloys containing at least one of Co, Ni or Fe, which are anisotropic in their magnetic response. Magnetic anisotropy is the directional dependence of a material's magnetic properties. In the absence of an applied magnetic field, a magnetically isotropic material has no preferential direction for its magnetic moment, while a magnetically anisotropic material will align its moment with one of the easy axes in the presence of an applied magnetic field.

An easy axis is an energetically favorable direction of spontaneous magnetization. The two opposite directions along an easy axis are usually equivalent, and the actual direction of magnetization can be along either of them. In the context of the present invention, there exists a hard axis of magnetization and an easy axis of magnetization in the plane of the film. Along the easy axis, the material tends to exhibit a higher coercivity and a highly non-linear relationship between applied magnetic field and magnetization. This is in contrast with the hard axis which the tends to exhibit lower coercivity and maintain a relatively linear relationship between applied magnetic field and magnetization.

Due to the low coercivity and linearity in magnetization, it is desirable to utilize the hard axis for most applications. In the case of an inductor, this would involve aligning the orientation of the hard axis with the expected orientation of magnetic field lines that originate from the inductor winding. The hard axis orientation can be controlled by applying a DC magnetic field along the desired orientation of the easy axis during deposition or by heating the film (annealing) to over 100 degrees Celsius after deposition. The magnitude of the applied magnetic field should be of equal or greater magnitude than the saturation field of the hard axis. The saturation field of the hard axis, which is the magnetic field that saturates the magnetization along the hard axis, is the same as the induced anisotropy of the material.

Patterned magnetic films, like those in the present invention, the induced anisotropy must overcome the shape anisotropy, or demagnetizing field ($H_{shape}$), in order for the magnetic film to maintain the desired orientation of anisotropy. Shape anisotropy is determined by the shape of the patterned film. For thin films, the magnitude of the demagnetizing field can be approximated as:

$$H_{shape} \approx M(N_w - N_l)$$

where, M is the material's saturation magnetization, and $N_w$-$N_l$ are the patterned films width and length, respectively.

Thus by definition, a film with high permeability will have low induced anisotropy, assuming constant saturation magnetization. Yet, in applications where a high permeability is required, it is difficult to achieve the desired orientation of anisotropy for specific geometries where the shape anisotropy exceeds the induced anisotropy.

Figure 13:
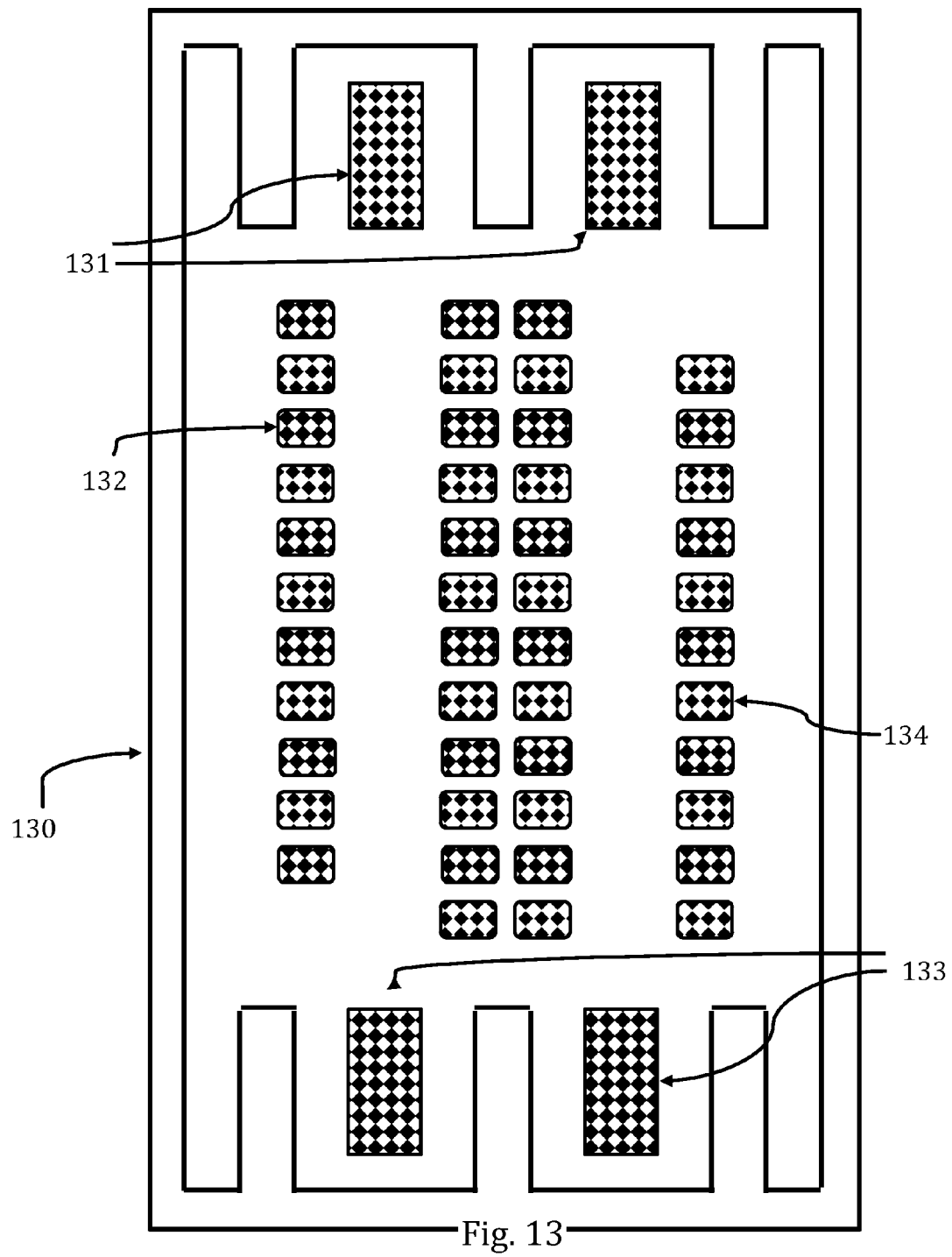
FIG. 13 illustrates an exemplary vertical interconnect conductive layout of an inductor.

FIG. 13 illustrates an exemplary vertical interconnect conductive layout 130 of a fully interleaved, ferromagnetic core inductor. It is helpful to view FIG. 13 as an overview of the layout of FIG. 11, as the elements of the bottom conductive layout 110 are in electrical communication with elements of vertical interconnect conductive layout 130. Vertical interconnect conductive layout 130 comprises primary VIAs 131, secondary terminal VIAs 133, primary interleaved coil VIAs 134 and secondary interleaved coil VIAs 132.

VIAs are fabricated in accordance with previous discussion. Crosshatchings of FIGS. 11, 13 demonstrate interconnectivity between the layers and electrical conductivity between elements on the same level. Primary and secondary interleaved coil VIAs 134, 132 electrically connect to primary windings 117, 118 and secondary winding 113, 115, respectively, and strengthen magnetically coupling.

In an alternate embodiment, VIAs are omitted. Instead, the top conductive layer is deposited over a non-planar surface such that the top and bottom conductive layers are electrically connected at the locations where VIAs would otherwise reside.

Figure 14:
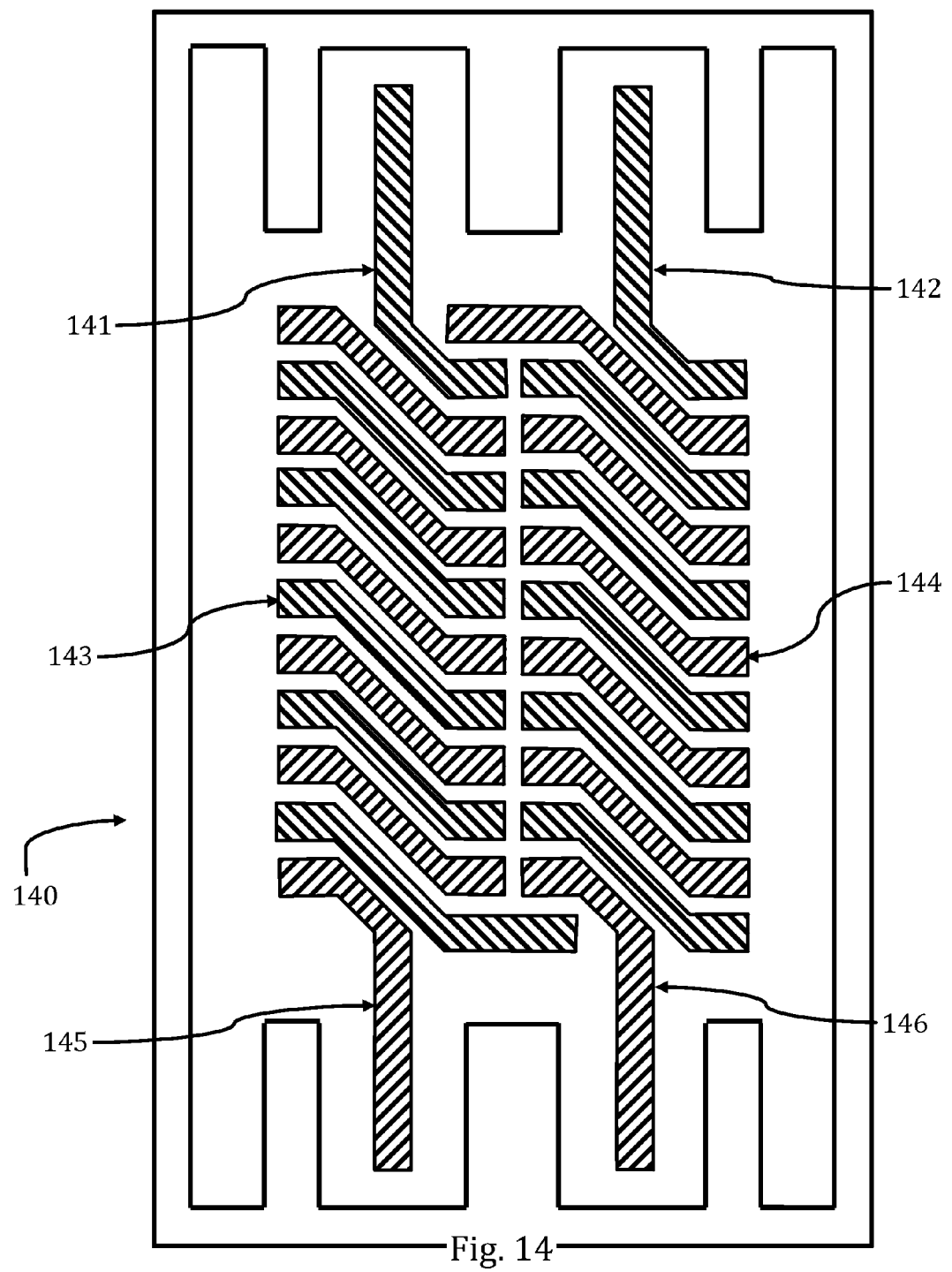
FIG. 14 illustrates an exemplary top conductive layout of an inductor.

FIG. 14 illustrates an exemplary top conductive layout 140 of a fully interleaved, magnetic core inductor. It is demonstrative to analyze FIG. 14, in view of FIGS. 11 and 13, as they are complementary to one another. Top conductive layout 140 comprises primary terminals 141, 142, secondary terminals 145, 146, primary winding 143, secondary winding 144. Top conductive layout 140 is made from conductive material (e.g., copper, aluminum etc.) disposed on top of (over) magnetic core layout 120 and vertical interconnect layout 130. Primary and secondary windings 143, 144 alternatingly interleave throughout the lengths of the primary and secondary coils, as depicted by crosshatching.

Figure 15:
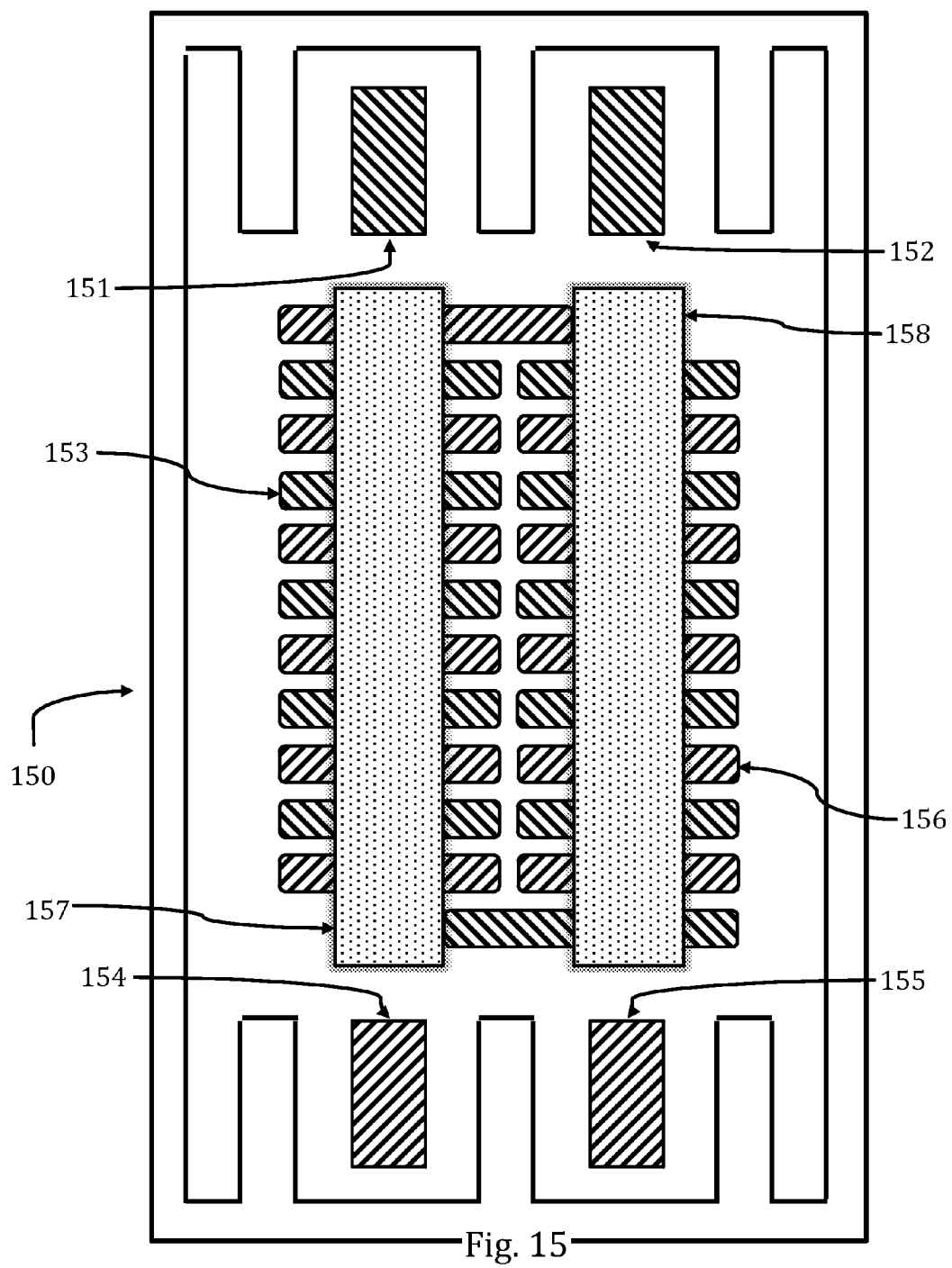
FIG. 15 illustrates an exemplary inductor using juxtaposed conductive and magnetic core layouts.

FIG. 15 illustrates an exemplary fully interleaved, coupled inductor 150 using conductive an magnetic core layout overlays, according to another embodiment of the present invention. Consistent with the discussion associated with FIGS. 2, 7, magnetic cores 157, 158 are patterned in shapes resembling rectangles. Designed to carry electrical current, primary and secondary windings 153, 156 wrap around both magnetic cores 157, 158.

Primary and secondary windings 153, 156 have primary and secondary electrical terminals 151-152, 154-155, respectively, which deliver current into and out of the device. Primary and secondary windings 153, 156 comprise a series of interleaving loops throughout their entire lengths. Since primary winding 153 loops around magnetic cores 157, 158, they are all magnetically coupled. The corollary is also observable. That is, the secondary winding 156 loops around magnetic cores 157, 158, which magnetically couples secondary winding 156 to magnetic cores 157, 158, and by extension, to primary winding 153.

In operation, inverse magnetic coupling is employed to avoid saturation. Specifically, high currents in the primary winding 153 threaten to saturate magnetic cores 157, 158. This can be mitigated and carefully controlled by passing a DC current through secondary winding 156 such that the induced magnetic field in counter in polarity induced by primary winding 153.

In one embodiment, the DC components of the signals traveling through primary and secondary windings 153, 156 are equal and opposite to one another. Effectively, this is akin to removing the DC offset of the signal allowing the AC to be affected solely by the AC influenced inductance. In another embodiment, the magnitude of the DC current in the secondary winding 156 is less than that of the primary 153 but disposes the coupled inductor just below saturation, thereby maximizing magnetic flux and inductance. This is analogous to biasing an amplifying transistor in its linear region. In yet another embodiment, the negative feedback is provided through the secondary winding 156, thereby accurately controlling and manipulating any desired inductance up to saturation.

Figure 16:
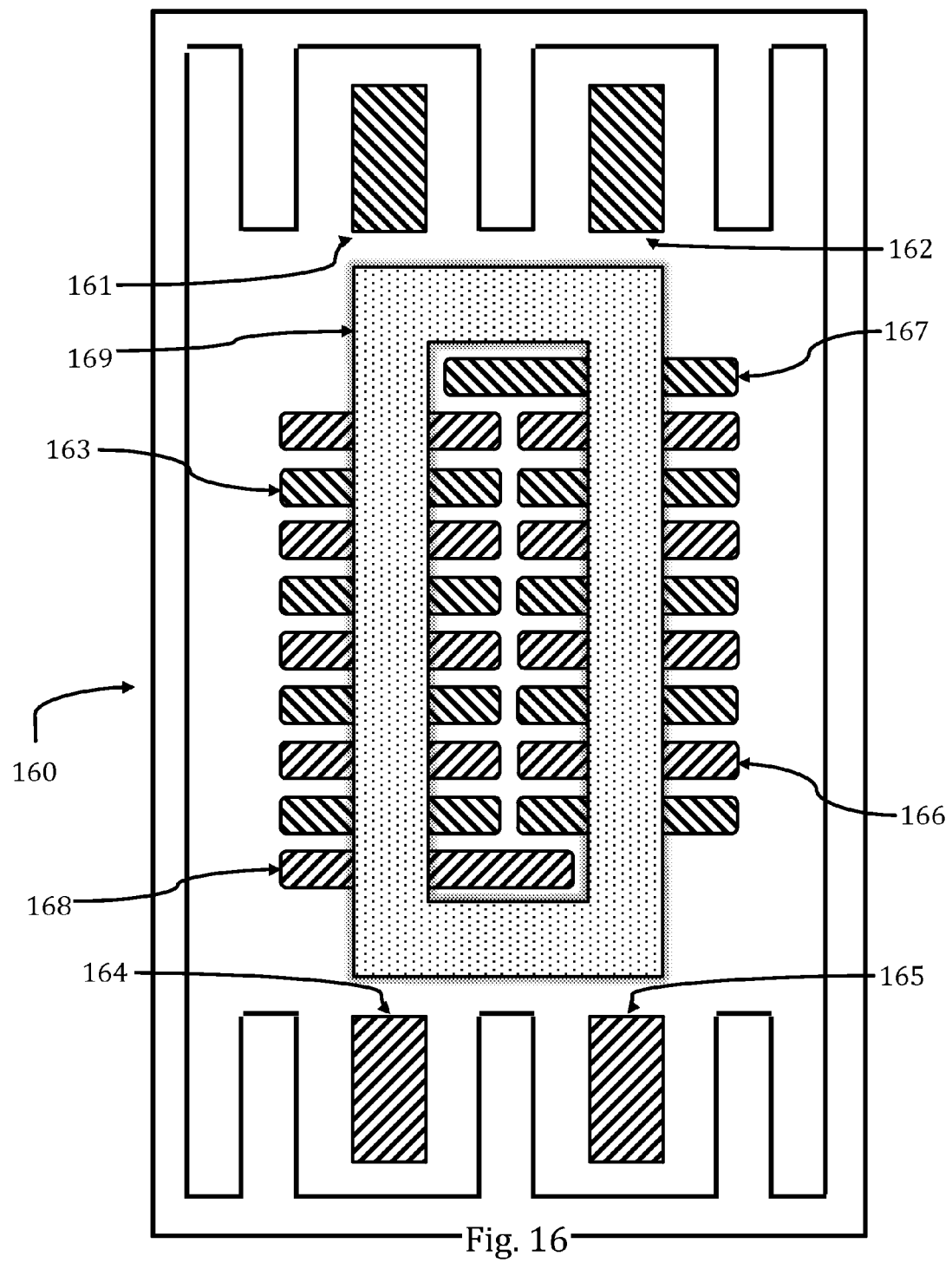
FIG. 16 illustrates an exemplary inductor using juxtaposed conductive and magnetic core layouts according to an alternate embodiment.

FIG. 16 illustrates an exemplary inductor using juxtaposed conductive and magnetic core layouts according to an alternate embodiment. Magnetic core 169 is patterned in the shape of a frame. In addition to electrical coupling pursuant to prior embodiment descriptions, frame-shaped magnetic core 169 also intensifies magnetic coupling, as is well known in the art.

Designed to carry electrical current, primary and secondary windings 163, 166 wrap around magnetic core 169. The electrical current gives rise to a magnetic field applied to the magnetic core 169. Consequently, magnetic domains within magnetic core 169 substantially align themselves around the perimeter of magnetic core 169 (its directionality depends on the polarity of the current), thereby augmenting magnetic coupling.

Primary and secondary windings 163, 166 have primary and secondary electrical terminals 161-162, 164-165, respectively, which deliver current into and out of the device though primary and secondary coil leads 167, 168, respectively. Primary and secondary windings 163, 166 comprise a series of interleaving loops throughout their lengths, at least in part. Primary winding 163 loops around magnetic core 169, which magnetically couples primary winding 163 to magnetic core 169, and by extension, to secondary winding 166. The converse is also true.

In operation, inverse magnetic coupling is employed to avoid saturation. Specifically, high currents in the primary winding 163 threaten to saturate magnetic core 169. This can be mitigated and carefully controlled by passing a DC current through secondary winding 166 such that the induced magnetic field in counter in polarity induced by primary winding 163.

In one embodiment, the DC components of the signals traveling through primary and secondary windings 163, 166 are equal and opposite to one another. Effectively, this is akin to removing the DC offset of the signal allowing the AC to be affected solely by the AC influenced inductance. In another embodiment, the magnitude of the DC current in the secondary winding 166 is less than that of the primary 163 but disposes the coupled inductor just below saturation, thereby maximizing magnetic flux and inductance. This is analogous to biasing an amplifying transistor in its linear region. In yet another embodiment, the negative feedback is provided through the secondary winding 166, thereby accurately controlling and manipulating any desired inductance up to saturation.

Figure 17:
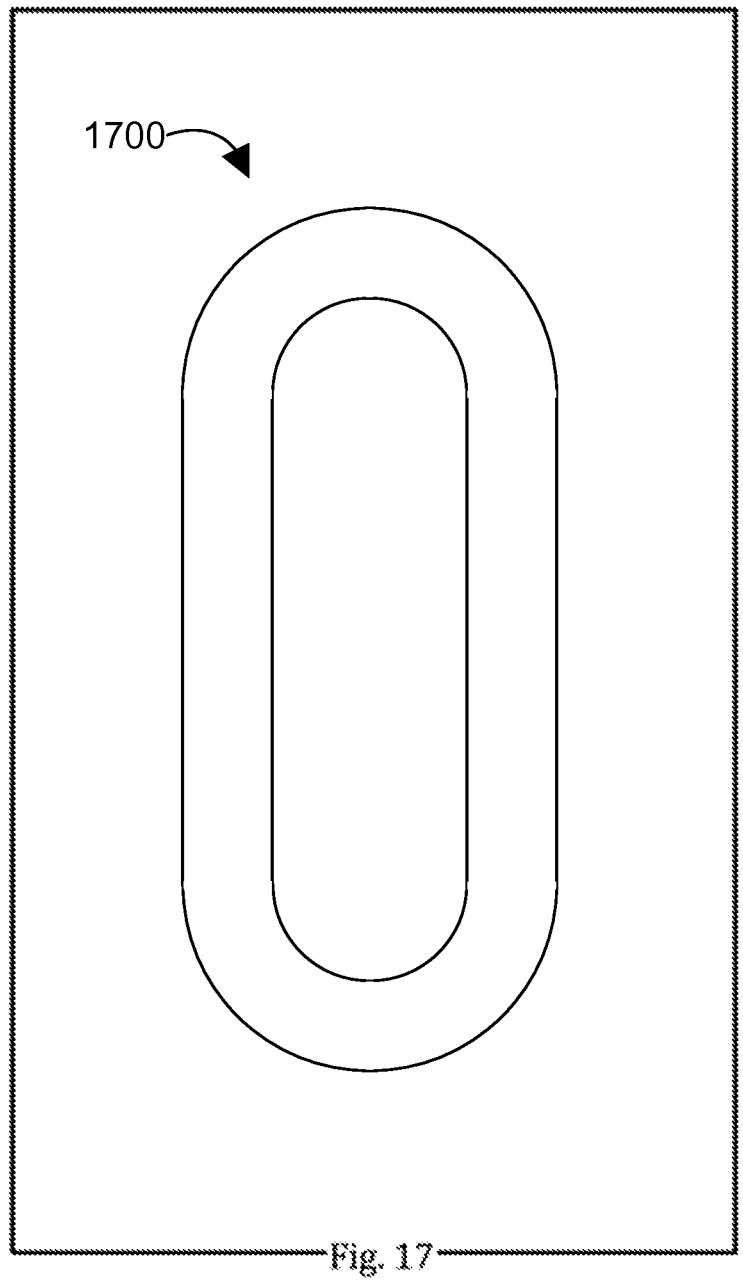
FIG. 17 illustrates an exemplary magnetic core layout.

In the present embodiment, magnetic core 169 is shaped substantially like a picture frame. In other embodiments, magnetic core 169, the shape of the combined cores could resemble a diamond shape, oval racetrack shape or similar closed loop geometry. This would similarly form a closed path for the magnetic flux to travel through the core. An example of an oval racetrack geometry 1700 is illustrated in FIG. 17.

In one or more embodiments, a plurality of more than two windings can be used in any of disclosed configurations. For example, tertiary and quaternary windings are with primary and secondary windings. Alternately, tertiary and quaternary windings are substantially wound around primary and secondary windings. The interweaving of the plurality of windings can partial, full or none.

In the simplest embodiment of the present invention, a single ferromagnetic core is comprised by a coupled inductor. A plurality of windings can be non, partially or fully interleaved. As with all of the disclosed embodiments, the coupled ferromagnetic core inductor is monolithically fabricated on an integrated circuit substrate with other integrated circuit elements comprising transistors.

However, it is not beyond the scope of the present invention to fabricate any disclosed device on an interposer substrate, thereby allowing attachment directly to an integrated circuit (e.g., transistors, etc.) using electrically coupling interconnects, such as solder balls. The preceding technique is commonly called chip stacking.

The disclosed devices can also be used as a transformer for integrated AC power conversion or as an inductor for resonance and frequency synthesis application. The disclosed invention can also be used as a tunable inductance using a DC bias current from one winding to bring the device to near saturation, thus controlling the permeability and consequently the inductance of the other winding in the device.

The embodiments described and illustrated herein are not meant by way of limitation, and are rather exemplary of the kinds of features and techniques that those skilled in the art might benefit from in implementing a wide variety of useful products and processes. For example, in addition to the applications described in the embodiments relating to switched-inductor power conversion, those skilled in the art would appreciate that the present disclosure can be applied to buck, boost, buck-boost and other DC-DC power conversion topologies. However, it is to be appreciated that the present exemplary embodiments are also amenable to other like applications.

The present invention should not be considered limited to the particular embodiments described above, but rather should be understood to cover all aspects of the invention as fairly set out in the attached claims. Various modifications, equivalent processes, as well as numerous structures, materials and unforeseen technologies to which the present invention may be applicable, will be readily apparent to those skilled in the art to which the present invention is directed upon review of the present disclosure. The claims are intended to cover such modifications and equivalents.

What is claimed is:

1. An integrated circuit comprising:
   a first ferromagnetic core constructed in a semiconductor device of said integrated circuit;
   a second ferromagnetic core constructed in said semiconductor device;
   a first winding wrapped around said first and second ferromagnetic cores; and
   a second winding wrapped around said first and second ferromagnetic cores;
   said first winding and said second winding being integrally constructed with said respective ferromagnetic cores,
   said first winding and said second winding configured to be inversely magnetically coupled to one another such that a first magnetic field induced by the first winding is opposite in polarity to a second magnetic field induced by the second winding, wherein the second magnetic field at least partially cancels the first magnetic field.

2. The integrated circuit of claim 1, wherein said first and second windings are at least partially interleaved with one another.

3. The integrated circuit of claim 1, wherein said first and second ferromagnetic cores substantially define a multilateral frame shape.

4. The integrated circuit of claim 1, wherein said first and second ferromagnetic cores substantially define an oval shape.

5. The integrated circuit of claim 1, wherein said first ferromagnetic core is substantially quadrilateral shaped.

6. The integrated circuit of claim 1, further comprising a plurality of more than two windings.

7. The integrated circuit of claim 1, wherein said first and second ferromagnetic cores comprise thin-films.

8. The integrated circuit of claim 7, wherein said first and second ferromagnetic cores further comprise laminated layers.

9. The integrated circuit of claim 8, wherein said first and second ferromagnetic cores further comprise alternating insulating layers, interspersed therebetween.

10. The integrated circuit of claim 1, wherein said first and second ferromagnetic cores are substantially rectangular in shape.

11. The integrated circuit of claim 1, wherein said first and second ferromagnetic cores further comprise a magnetically anisotropic material.

12. The integrated circuit of claim 11, wherein a hard axis of said magnetically anisotropic material is oriented to be at least partially magnetized by said first and second windings.

13. The integrated circuit of claim 1, wherein a thickness of said first and second ferromagnetic cores range between 1 and 10 μm in thickness.

14. The integrated circuit of claim 1, wherein the circuit is monolithically fabricated.

15. The integrated circuit of claim 1, wherein the circuit is fabricated using chip stacking technology.

16. The integrated circuit of claim 1, wherein the first and second magnetic fields form a single flux path.

17. The integrated circuit of claim 1, wherein a first DC component of a first signal passing through the first winding is equal and opposite to a second DC component of a second signal passing through the second winding.

* * * * *